(12) United States Patent
Ishimine et al.

(10) Patent No.: US 9,293,384 B2
(45) Date of Patent: Mar. 22, 2016

(54) SILICON NITRIDE SUBSTRATE, CIRCUIT SUBSTRATE AND ELECTRONIC DEVICE USING THE SAME

(75) Inventors: Yuusaku Ishimine, Kyoto (JP);
Masayuki Moriyama, Kyoto (JP);
Kenji Komatsubara, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 897 days.

(21) Appl. No.: 13/522,218

(22) PCT Filed: Jan. 13, 2011

(86) PCT No.: PCT/JP2011/050436
§ 371 (c)(1),
(2), (4) Date: Jul. 13, 2012

(87) PCT Pub. No.: WO2011/087055
PCT Pub. Date: Jul. 21, 2011

(65) Prior Publication Data
US 2012/0281362 A1    Nov. 8, 2012

(30) Foreign Application Priority Data
Jan. 13, 2010  (JP) ................................ 2010-004619

(51) Int. Cl.
*H01L 23/15*    (2006.01)
*H05K 7/20*    (2006.01)
(Continued)

(52) U.S. Cl.
CPC .............. *H01L 23/13* (2013.01); *C04B 35/587* (2013.01); *C04B 37/026* (2013.01); *H01L 23/15* (2013.01); *H01L 35/32* (2013.01); *C04B 2235/3206* (2013.01); *C04B 2235/3217* (2013.01); *C04B 2235/3224* (2013.01); *C04B 2235/3878* (2013.01); *C04B 2235/3882* (2013.01);
(Continued)

(58) Field of Classification Search
None
See application file for complete search history.

(56) References Cited

U.S. PATENT DOCUMENTS 6,143,677 A * 11/2000 Miyanaga et al. ........... 501/97.4
2009/0224399 A1* 9/2009 Kaga et al. .................... 257/712

FOREIGN PATENT DOCUMENTS

JP    04-125986 H    4/1992
JP    H06-064988 A    3/1994
(Continued)

OTHER PUBLICATIONS

Office Action dated May 12, 2014 issued for counterpart Japanese application No. 2011-550002.
(Continued)

*Primary Examiner* — Monique Jackson
(74) *Attorney, Agent, or Firm* — Procopio, Cory, Hargreaves & Savitch LLP

(57) ABSTRACT

A silicon nitride substrate comprises a substrate comprising a silicon nitride sintered body, and a plurality of granular bodies containing silicon and integrated to a principal surface of the substrate, wherein a plurality of needle crystals or column crystals comprising mainly silicon nitride are extended from a portion of the granular bodies. A brazing material is applied to a principal surface of the substrate, and a circuit member and a heat radiation member are arranged on the applied brazing material, and bonded by heating. Because of a plurality of granular bodies integrated to the principal surface of the substrate, and a plurality of the needle crystals or the column crystals extended from a portion of the granular bodies, a high anchor effect is produced so that the circuit member and the heat radiation member are firmly bonded to the silicon nitride substrate.

12 Claims, 10 Drawing Sheets

(51) Int. Cl.
*H05K 1/00* (2006.01)
*B32B 33/00* (2006.01)
*H01L 23/13* (2006.01)
*H01L 35/32* (2006.01)
*C04B 35/587* (2006.01)
*C04B 37/02* (2006.01)
*H05K 1/03* (2006.01)
*H05K 3/38* (2006.01)

(52) U.S. Cl.
CPC . *C04B2235/5276* (2013.01); *C04B 2235/5436* (2013.01); *C04B 2235/5445* (2013.01); *C04B 2235/604* (2013.01); *C04B 2235/6581* (2013.01); *C04B 2235/6582* (2013.01); *C04B 2235/6587* (2013.01); *C04B 2235/721* (2013.01); *C04B 2235/723* (2013.01); *C04B 2235/77* (2013.01); *C04B 2235/786* (2013.01); *C04B 2235/80* (2013.01); *C04B 2235/945* (2013.01); *C04B 2235/9607* (2013.01); *C04B 2237/125* (2013.01); *C04B 2237/368* (2013.01); *C04B 2237/407* (2013.01); *C04B 2237/74* (2013.01); *H01L 2924/0002* (2013.01); *H05K 1/0306* (2013.01); *H05K 3/38* (2013.01); *H05K 2201/0248* (2013.01); *H05K 2201/0266* (2013.01); *H05K 2201/0269* (2013.01); *Y10T 428/24413* (2015.01); *Y10T 428/24421* (2015.01); *Y10T 428/25* (2015.01); *Y10T 428/259* (2015.01)

(56) References Cited

FOREIGN PATENT DOCUMENTS

| | | |
|---|---|---|
| JP | H11-214582 A | 8/1999 |
| JP | 2000-138424 A | 5/2000 |
| JP | 2002-201076 A | 7/2002 |
| JP | 2003-101217 A | 4/2003 |
| JP | 3539634 B2 | 7/2004 |
| JP | 2007-189112 A | 7/2007 |
| WO | 2009/131217 A1 | 10/2009 |

OTHER PUBLICATIONS

Office Action dated Dec. 17, 2013, issued in counterpart Japanese Application No. 2011-550002.
International Search Report dated Apr. 12, 2011, issued for International Application No. PCT/JP2011/050436.

* cited by examiner

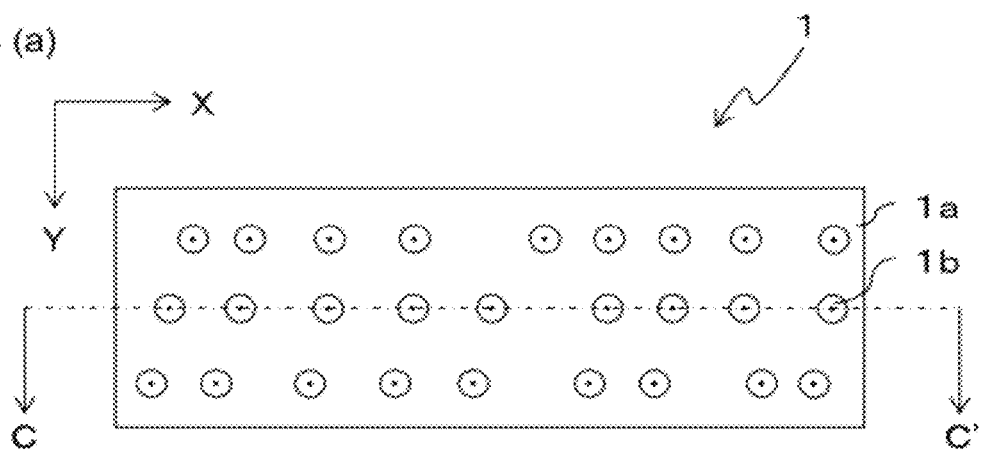
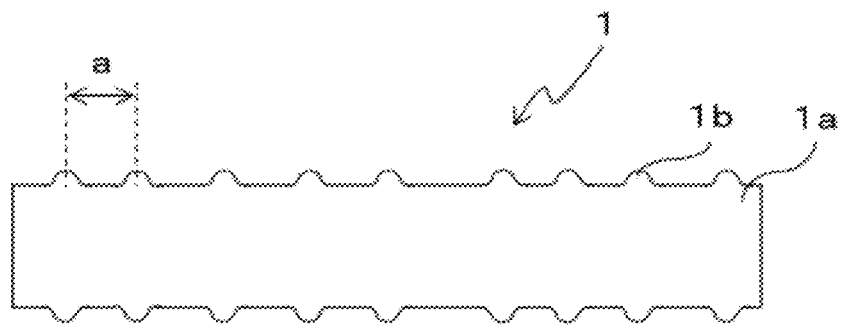

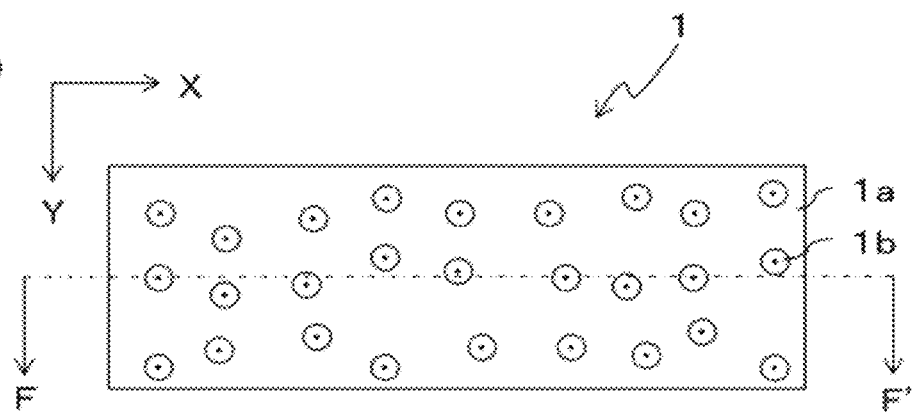
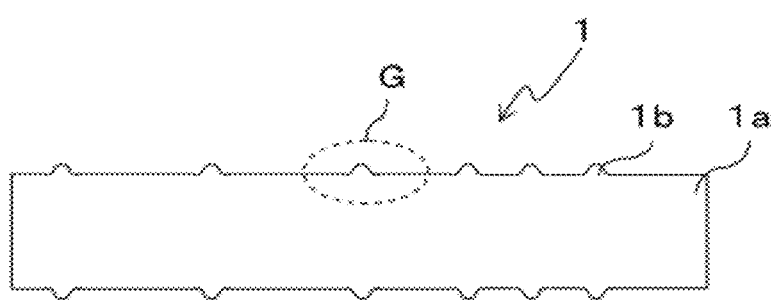
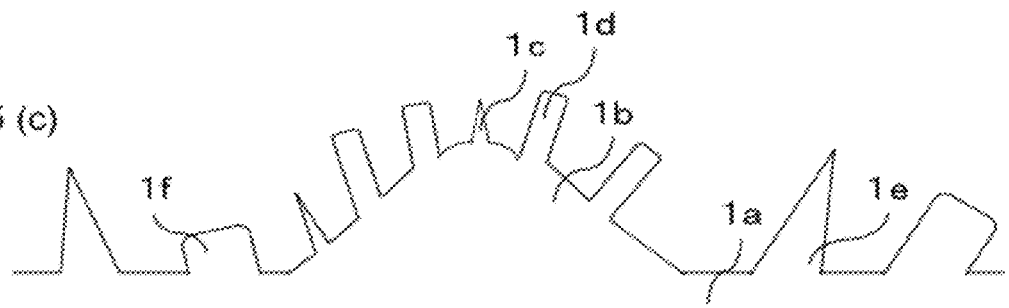

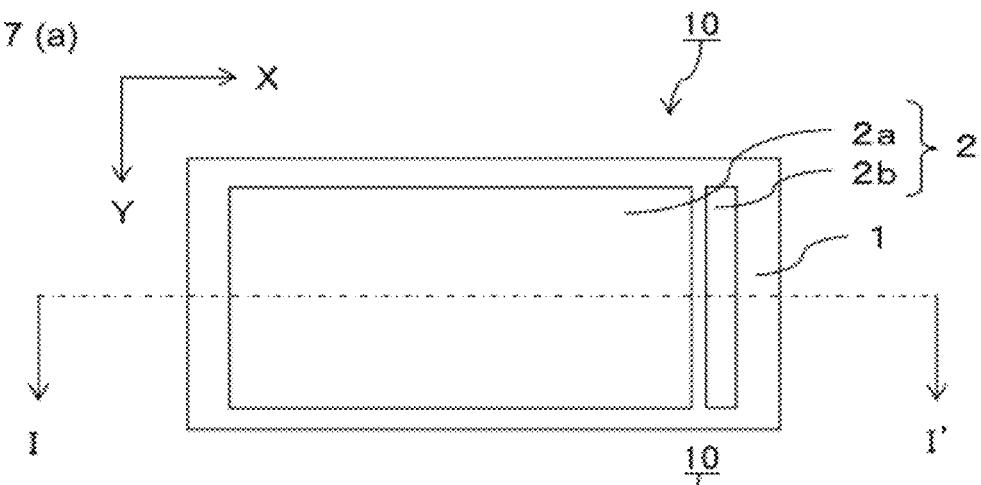
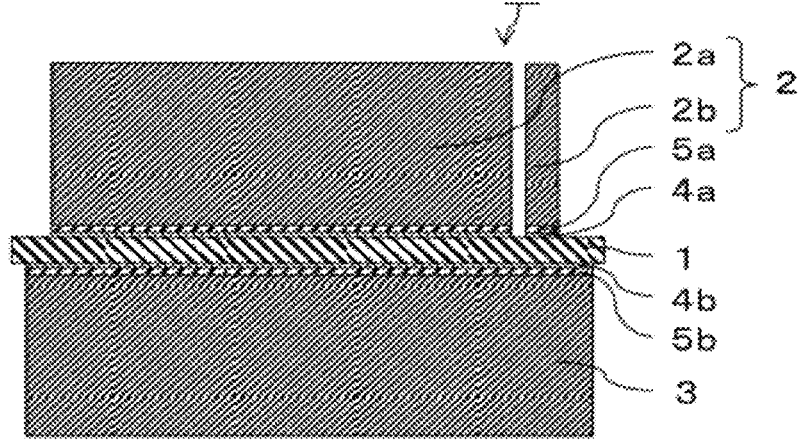
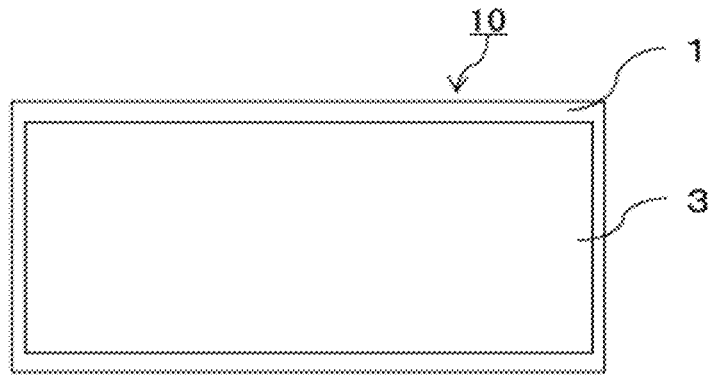

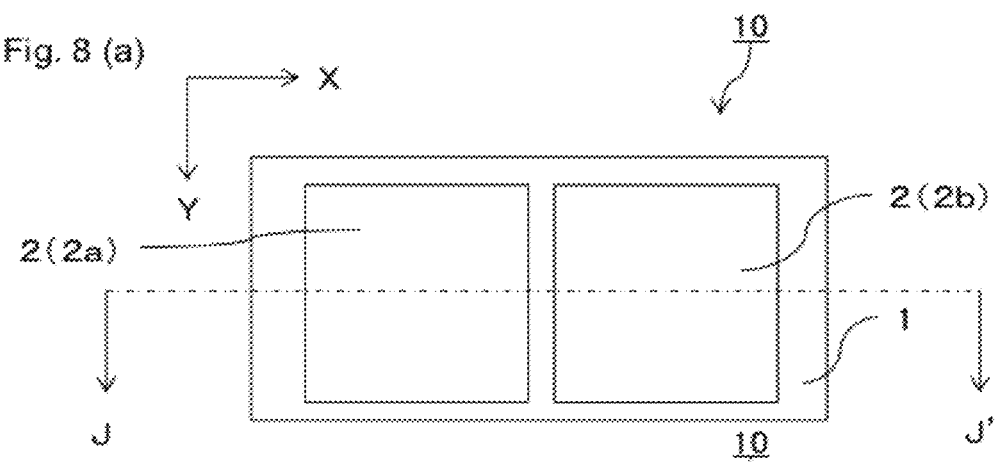
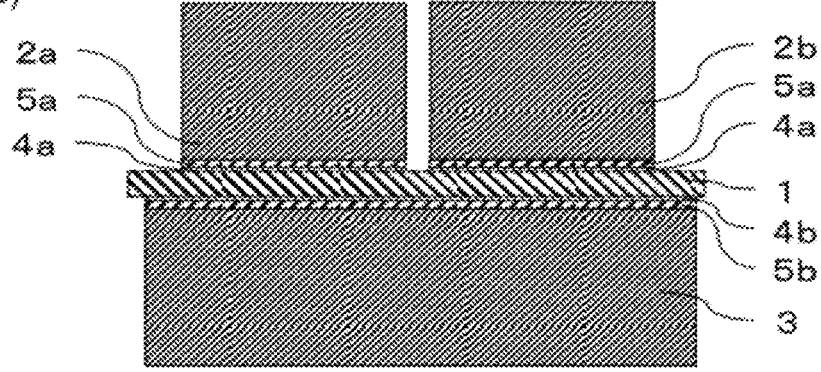
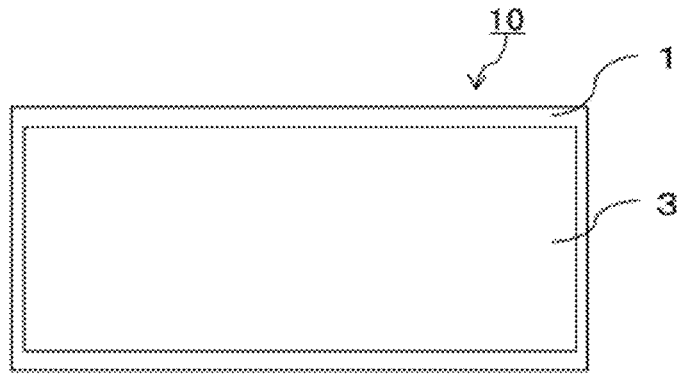

SILICON NITRIDE SUBSTRATE, CIRCUIT SUBSTRATE AND ELECTRONIC DEVICE USING THE SAME

TECHNICAL FIELD

The present invention relates to a silicon nitride substrate which is used as a support substrate for a heat radiation member or a circuit member. The present invention further relates to a circuit substrate, wherein a circuit member and a heat radiation member made primarily of copper or aluminum are bonded through a brazing material to each of principal surfaces on both sides of the support substrate made of the silicon nitride substrate, and an electronic device, wherein electronic components are mounted on the circuit member bonded to the circuit substrate.

BACKGROUND ART

Recently, as components of semiconductor units, electronic devices having various types of electronic components mounted on circuit members of circuit substrates are being used, in which the electronic components include a semiconductor device, a dye sublimation thermal printhead device and a thermal ink-jet printhead device, wherein the semiconductor device includes an insulated gate bipolar transistor (IGBT) device, an intelligent power module (IPM) device, a metal oxide semiconductor field effect transistor (MOSFET) device, a light emitting diode (LED) device, a freewheeling diode (FWD) device, a giant transistor (GTR) device, and a Peltier device.

A circuit substrate with a circuit member mounted electronic components is a circuit substrate, in which a circuit member and a heat radiation member made of a metal having high thermal conductivity are respectively bonded through a brazing material to each of principal surfaces on both sides of the support substrate made of insulating ceramics. As for a support substrate made of insulating ceramics, a silicon nitride substrate having excellent thermal conductivity and mechanical properties is attracting attention.

As an example of such a silicon nitride substrate, Patent Document 1 proposes a silicon nitride substrate for mounting a circuit substantially made of a silicon nitride sintered body substrate made of silicon nitride particles and a grain boundaries, wherein the surface of the substrate has the following properties: the area ratio of the silicon nitride grains is 70 to 100% when the total area ratio of the silicon nitride grains and the grain boundaries on the surface of the sintered body substrate is 100%; the distance (L) between the highest peak of the silicon nitride grains exposed on the surface and the lowest bottom of the silicon nitride grains or the grain boundaries is 1.5 to 15 µm; and the surface has centerline average surface roughness (Ra) of 0.2 to 5 µm.

As methods for conditioning the surface texture of the silicon nitride substrate, Patent Document 1 discloses methods for mechanically removing the grain boundaries by mechanical processing such as sand blasting, shot blasting, grit blasting or hydroblasting.

PRIOR ART DOCUMENT

Patent Document

Patent Document 1: Japanese Patent No. 3539634

SUMMARY OF THE INVENTION

Problem to be Solved by the Invention

However, since the silicon nitride substrate for mounting a circuit proposed in Patent Document 1 mechanically is removed the grain boundaries by mechanical processing such as sand blasting, shot blasting, grit blasting or hydroblasting with a view to conditioning the surface properties, the silicon nitride grains present on the surface of the silicon nitride substrate are prone to drop off. Moreover, at the surface of the silicon nitride substrate from which the grain boundaries is mechanically removed by the mechanical processing, a brazing material does not easily fill the voids created by the removal of the grain boundaries. Thus, the silicon nitride substrate falls short of meeting with the current demand of high bond strength of high reliability capable of preventing the detachment of a metal circuit board caused by repeated heating and cooling cycles associated with operating electronic components such as a semiconductor device.

The present invention was conceived to solve the described above problems. The present invention provides a silicon nitride substrate capable of enhancing the bond strength when a member made of metals such as a circuit member or a heat radiation member is bonded with the silicon nitride substrate; and a circuit substrate and an electronic device capable of improving reliability by using the silicon nitride substrate.

Means for Solving the Problem

In the silicon nitride substrate of the present invention, a plurality of granular bodies containing silicon are integrated to a principal surface of the substrate made of a silicon nitride sintered body, and a plurality of needle crystals or column crystals comprising mainly of silicon nitride are extended from a portion of the granular bodies.

In the circuit substrate of the present invention, a metallic circuit member and a metallic heat radiation member are respectively bonded through a brazing material to each of principal surfaces of a support substrate made of the silicon nitride substrate of the present invention.

In the electronic device of the present invention, electronic components are mounted on the circuit member bonded to the circuit substrate of the present invention.

Effects of The Invention

According to the silicon nitride substrate of the present invention, a plurality of granular bodies containing silicon are integrated to a principal surface of the substrate made of a silicon nitride sintered body, and a plurality of needle crystals or column crystals made mainly of silicon nitride are extended from a portion of the granular bodies. Therefore, after a brazing material is applied to a principal surface of the substrate and a metallic circuit member and a metallic heat radiation member are arranged on the applied brazing material, the set is heated to bond the silicon nitride substrate and the members made of a metal. Because a high anchor effect is produced by the needle crystals or column crystals between the silicon nitride substrate and the brazing material, the silicon nitride substrate and the members made can be firmly bonded.

According to the circuit substrate of the present invention, a metallic circuit member is bonded to one principal surface of a support substrate made of the silicon nitride substrate of the present invention, and a metallic heat radiation member is bonded to the other principal surface of the support substrate through a brazing material, respectively. Because a support substrate made of the silicon nitride substrate of the present invention which is capable of producing a high anchor effect is used, adhesion of the brazing material to the support substrate is enhanced so that the support substrate, and the circuit member and the heat radiation member can be firmly bonded.

According to the electronic device of the present invention, electronic components are mounted on the circuit member bonded to the circuit substrate of the present invention. Thus, even if the electronic components repeatedly generate heat, the support substrate, and the circuit member and the heat radiation member will not easily detach from each other, and this will enable to prepare a highly durable electronic device.

BRIEF DESCRIPTION OF THE DRAWINGS

FIG. 1(a) is a plan view, FIG. 1(b) is a cross-sectional view of FIG. 1(a) along the line A-A' and FIG. 1(c) is a partially enlarged view of section B of FIG. 1(b).

FIG. 3 schematically shows another example of a silicon nitride substrate of the embodiment: FIG. 3(a) is a plan view and FIG. 3(b) is a cross-sectional view of FIG. 3(a) along the line C-C'.

FIG. 4(a) is a plan view, FIG. 4(b) is a cross-sectional view of FIG. 4(a) along the line D-D' and FIG. 4(c) is a cross-sectional view of FIG. 4(a) along the line E-E'.

FIG. 5 schematically shows another example of a silicon nitride substrate of the embodiment: FIG. 5(a) is a plan view, FIG. 5(b) is a cross-sectional view of FIG. 5(a) along the line F-F' and FIG. 5(c) is a partially enlarged view of section G of FIG. 5(b).

FIG. 6(a) is a plan view, FIG. 6(b) is a cross-sectional view of FIG. 6(a) along the line H-H' and FIG. 6(c) is a bottom view.

FIG. 7 shows another example of a circuit substrate of the embodiment: FIG. 7(a) is a plan view, FIG. 7(b) is a cross-sectional view of FIG. 7(a) along the line I-I' and FIG. 7(c) is a bottom view.

FIG. 8 shows another example of a circuit substrate of the embodiment: FIG. 8(a) is a plan view, FIG. 8(b) is a cross-sectional view of FIG. 8(a) along the line J-J' and FIG. 8(c) is a bottom view.

FIG. 9(a) is a plan view, FIG. 9(b) is a cross-sectional view of FIG. 9(a) along the line K-K' and FIG. 9(c) is a bottom view.

FIG. 10(a) is a partially broken perspective view and FIG. 10(b) is a cross-sectional view.

MODE FOR CARRYING OUT THE INVENTION

Examples of a silicon nitride substrate, a circuit substrate and an electronic device of the embodiment are hereinafter described.

Figure 1:
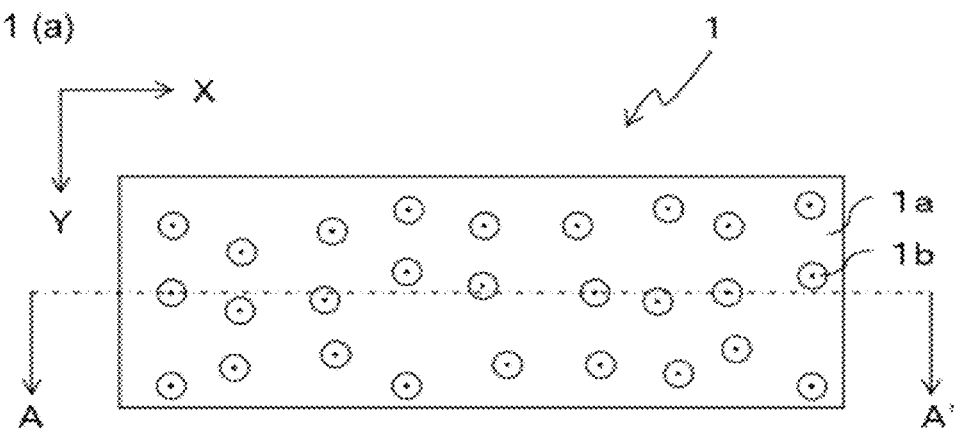
FIG. 1 schematically shows an example of a silicon nitride substrate of the embodiment.
Figure 1:
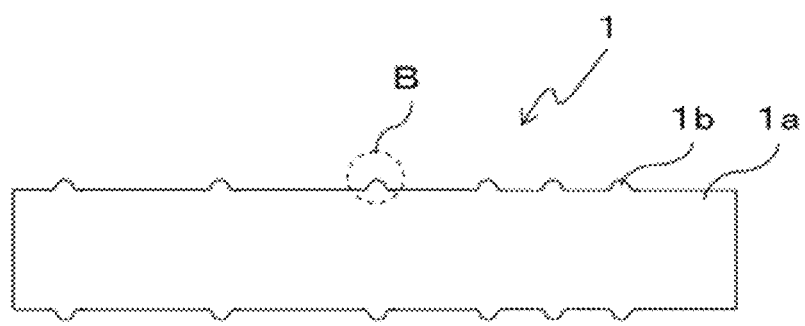
Figure 1:
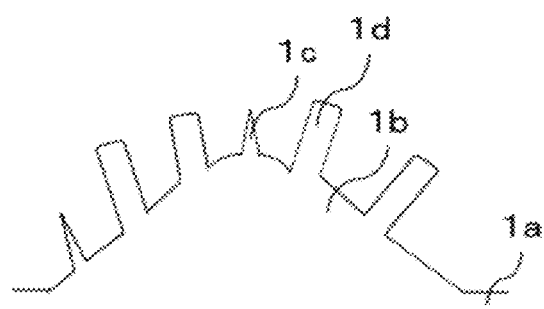

FIG. 1 schematically shows an example of a silicon nitride substrate of the embodiment: FIG. 1(a) is a plan view, FIG. 1(b) is a cross-sectional view of FIG. 1(a) along the line A-A' and FIG. 1(c) is a partially enlarged view of section B of FIG. 1(b).

As shown in FIG. 1(a) and FIG. 1(b), a silicon nitride substrate 1 of the embodiment has a plurality of granular bodies 1b containing silicon integrated to a principal surface (the surface illustrated in FIG. 1(a)) of a substrate 1a made of a silicon nitride sintered body. The granular bodies 1b are obtained by calcining granules or particulates. The granules are prepared by drying with a spray dryer a slurry made of a mixed and crushed powder containing silicon. The particulates are placing powder and the like prepared by crushing a sintered body formed by calcining a powder containing silicon. As shown in FIG. 1(c), the surface configuration of the substrate 1a is such that a plurality of needle crystals 1c or column crystals 1d made primarily of silicon nitride are extended from a portion of the granular bodies 1b. After a brazing material is applied to a principal surface of the substrate 1a and a member made of a metal (hereinafter referred to as a "metal member") such as a circuit member or a heat radiation member is arranged on the applied brazing material (the metal member is not shown in FIG. 1), the set is heated to bond the silicon nitride substrate 1 and the metal member. Because a high anchor effect is produced by the needle crystals 1c or the column crystals 1d between the silicon nitride substrate 1 and the brazing material, the silicon nitride substrate 1 and the metal member can be firmly bonded. Alternatively, a metal member may be directly arranged on a principal surface of the substrate 1a and be heated to form a firmer bond than the bond obtained by using conventional substrates due to a similar effect.

The silicon nitride sintered body constituting the substrate 1a contains silicon nitride in an amount of 80% by mass or more, particularly, it is preferable to contain 90% by mass or more. Other additive ingredients may include at least one of magnesium oxide (MgO) and calcium oxide (CaO), and an oxide of a rare earth element, for example, at least any one of $Sc_2O_3$, $Y_2O_3$, $La_2O_3$, $Ce_2O_3$, $Pr_6O_{11}$, $Nd_2O_3$, $Pm_2O_3$, $Pm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$.

The main ingredient of a silicon nitride sintered body is silicon nitride, and it may be identified by an X-ray diffraction method. The content of silicon nitride may be obtained by measuring the silicon (Si) content by X-ray fluorescence analysis or inductively coupled plasma (ICP) optical emission spectrometry, and converting the silicon content to the silicon nitride ($Si_3N_4$) content.

A plurality of granular bodies 1b integrated to a principal surface of the substrate 1a contain silicon. Specifically, the granular bodies 1b preferably contain at least any one of silicon, silicon nitride, silicon oxide and sialon, and these ingredients may be identified by a thin film X-ray diffraction method or with a transmission electron microscope. Any cross section of the granular bodies 1b at the principal surface has a width of 10 μm or more and 48 μm or less, and the height from the principal surface is 16 μm or more and 52 μm or less. Such a width and a height of the granular bodies may be measured using an optical microscope set at a magnification of 100 times or larger and 500 times or smaller.

A plurality of the needle crystals 1c or the column crystals 1d extended from a portion of the granular bodies 1b are mainly made of silicon nitride in an amount of preferably 60% by mass or more, and more preferably 70% by mass or more.

The silicon nitride which is the main ingredient of the needle crystals 1c or the column crystals 1d may be identified by a thin film X-ray diffraction method or with a transmission electron microscope. The content of the silicon nitride may be obtained by measuring the silicon (Si) content with a transmission electron microscope, and converting the silicon content to the silicon nitride ($Si_3N_4$) content. The extended length of the needle crystals $1c$ or the column crystals $1d$ from the surface of the granular bodies $1b$ is 2 μm or more and 10 μm or less, and the diameter of the needle crystals $1c$ or the column crystals $1d$ at the middle of the extended length is 0.2 μm or more and 5 μm or less. Such the needle crystals $1c$ or the column crystals $1d$ may be confirmed using an optical microscope set at a magnification of 100 times or larger and 1000 times or smaller.

A plurality of the needle crystals $1c$ or the column crystals $1d$ extended from a portion of the granular bodies $1b$ are preferably not oriented towards a certain direction. A higher anchor effect may be produced by not oriented towards a certain direction.

Figure 2:
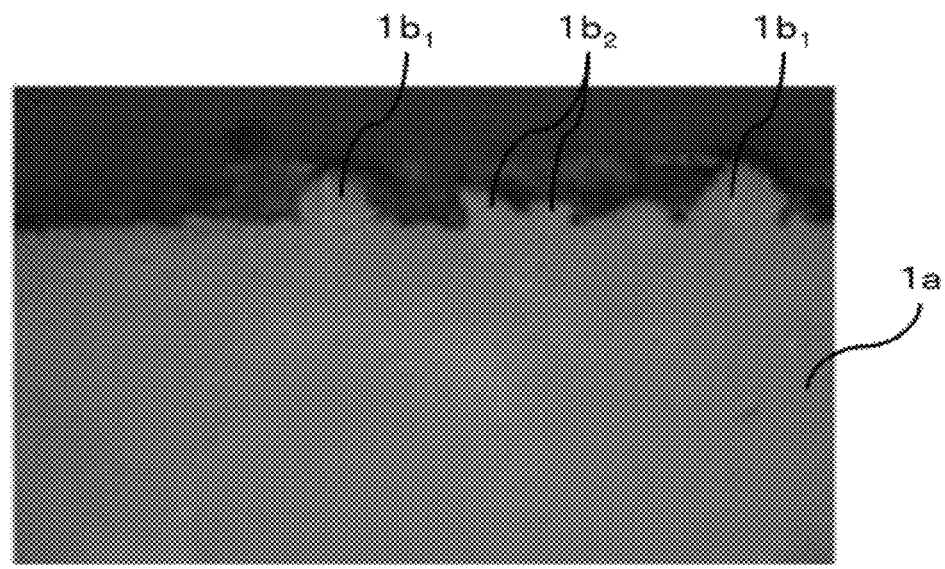
FIG. 2 is a photograph showing a cross-sectional view of granular bodies on a silicon nitride substrate of the embodiment.

FIG. 2 is a photograph showing a cross-sectional view of granular bodies on a silicon nitride substrate of the embodiment.

In the photograph of a cross section of the example of the silicon nitride substrate 1 shown in FIG. 2, granular bodies $1b_1$ integrated in a hemisphere against a principal surface of the substrate $1a$ and granular bodies $1b_2$ having a shape other than a hemisphere are shown. The granular bodies $1b$ are preferably integrated in a hemisphere against a principal surface of the substrate $1a$. When the granular bodies $1b$ are integrated in a hemisphere against a principal surface of the substrate $1a$, as is the case with the granular bodies $1b_1$, the residual stress after calcining is less apt to remain in the vicinity of the granular bodies $1b_1$ relative to the granular bodies $1b_2$ formed in a shape other than a hemisphere, thus reducing the risk of impairing the strength of the substrate $1a$.

The hemisphere referred to in the embodiment includes a configuration which may be obtained by cutting a true sphere, an oblate spheroid, a prolate spheroid and others at close to the center, and which does not have any corner section throughout the whole surface. The ratio of the number of the granular bodies $1b_1$ integrated in a hemisphere to the number of all the granular bodies $1b$ is preferably 55% or more.

FIG. 3 schematically shows another example of a silicon nitride substrate of the embodiment: FIG. 3($a$) is a plan view and FIG. 3($b$) is a cross-sectional view of FIG. 3($a$) along the line C-C'.

As shown in the example in FIG. 3, the granular bodies $1b$ are preferably arranged in a plurality of lines on the silicon nitride substrate 1 of the embodiment. When the granular bodies $1b$ are arranged in a plurality of lines, inconsistencies by location arising in the extent of the high anchor effect produced by the surface configuration of the silicon nitride substrate 1 of the embodiment at the time of bonding the silicon nitride substrate 1 and a metal member may be suppressed. The distance a between two centers of adjacent granular bodies $1b$ arranged in a plurality of lines is preferably, for example, 0.1 mm or more and 0.5 mm or less.

Figure 4:
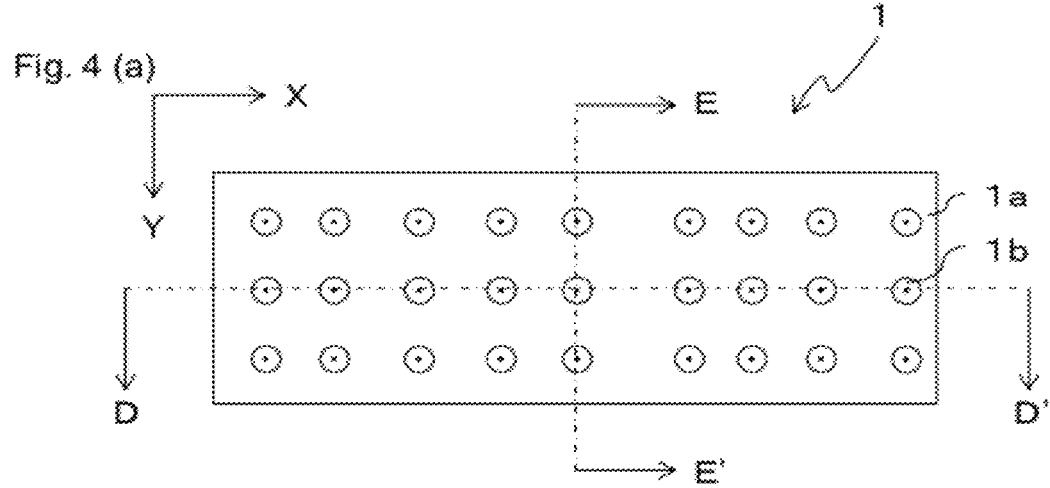
FIG. 4 schematically shows another example of a silicon nitride substrate of the embodiment.
Figure 4:
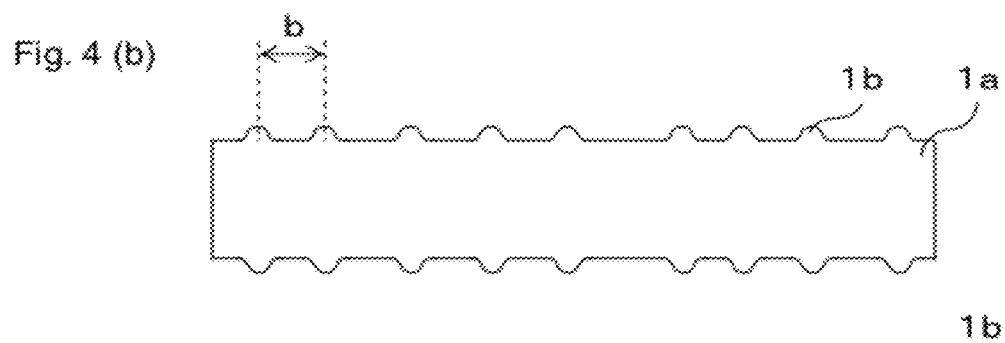
Figure 4:
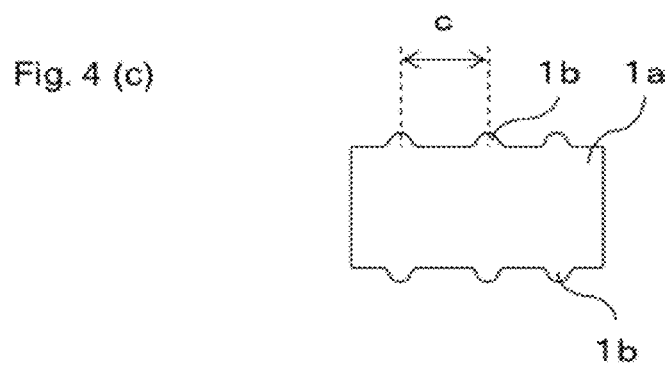

FIG. 4 schematically shows another example of a silicon nitride substrate of the embodiment: FIG. 4($a$) is a plan view, FIG. 4($b$) is a cross-sectional view of FIG. 4($a$) along the line D-D' and FIG. 4($c$) is a cross-sectional view of FIG. 4($a$) along the line E-E'.

In the silicon nitride substrate 1 of the example shown in FIG. 3, between the X-direction and the Y-direction illustrated in FIG. 2($a$), the granular bodies $1b$ are arranged in a plurality of lines in the X-direction only. Meanwhile, in the example of the silicon nitride substrate 1 shown in FIG. 4, the granular bodies $1b$ are arranged in a plurality of lines both in the X-direction and the Y-direction. When the granular bodies $1b$ are arranged in a plurality of lines both in the X-direction and the Y-direction in this way, inconsistencies by location arising in the extent of the high anchor effect produced by the surface configuration of the silicon nitride substrate 1 of the embodiment at the time of bonding the silicon nitride substrate 1 and a metal member may be suppressed. The distances b and c between two centers of adjacent granular bodies $1b$ arranged in a plurality of lines both in the X-direction and the Y-direction are both preferably, for example, 0.1 mm or more and 0.5 mm or less.

In FIGS. 1, 3 and 4, the silicon nitride substrate 1 in which the plurality granular bodies $1b$ containing silicon are integrated to both principal surfaces of the substrate $1a$ made of a silicon nitride sintered body is shown. However, in the case where a metal member is bonded only on one principal surface, the granular bodies $1b$ need to be integrated only to the principal surface.

The density of the granular bodies $1b$ on the silicon nitride substrate 1 of the embodiment is preferably 48 pieces/cm$^2$ or more and 502 pieces/cm$^2$ or less. When the density of the granular bodies $1b$ fall within this range, the granular bodies $1b$ will not scatter or cohere and will be arranged at adequate distances. Thus, by having a plurality of the needle crystals $1c$ or the column crystals $1d$ mainly made of silicon nitride extended from a portion of the granular bodies $1b$ arranged at adequate distances, the anchor effect between the silicon nitride substrate 1 and a brazing material is enhanced, and the silicon nitride substrate 1 and a metal member may be bonded more firmly. Particularly, the density of the granular bodies $1b$ is preferably 102 pieces/cm$^2$ or more and 448 pieces/cm$^2$ or less.

The density of the granular bodies $1b$ may be found with an optical microscope set at a magnification of 50 times or larger and 1000 times or smaller by selecting an area of, for example, 170 μm×170 μm from a principal surface of the substrate $1a$, counting the number of the granular bodies $1b$ within the area, and calculating the number of the granular bodies $1b$ for an area of 1 cm$^2$.

The granular bodies $1b$ on the silicon nitride substrate 1 of the embodiment preferably contain an oxide of aluminum. When the granular bodies $1b$ contain an oxide of aluminum, that is, when powder bodies constituting the granular bodies $1b$ contain an oxide of aluminum, liquid phase sintering is further accelerated in the sintering step. Thus, the granular bodies $1b$ will be firmly bonded to the substrate $1a$ to form integrated entities, and the mechanical strength may be enhanced. Particularly, when an oxide of aluminum is magnesium aluminate, the granular bodies $1b$ will be firmly bonded to the substrate $1a$ to form integrated entities, and concurrently corrosion resistance of the grain boundary phase present in the space between the crystals forming the granular bodies $1b$ improves, thus corrosion resistance of the granular bodies $1b$ may be enhanced. An oxide of aluminum contained in the granular bodies $1b$ may be identified by a thin film X-ray diffraction method or with a transmission electron microscope.

In the silicon nitride substrate 1 of the embodiment, the content of an oxide of aluminum in the substrate $1a$ is preferably less than that in the granular bodies $1b$. When the content of an oxide of aluminum in the substrate $1a$ is less than that in the granular bodies $1b$, phonon propagation is accelerated in the crystals forming the substrate $1a$ and in the grain boundary phase present in the space between the crystals, thus heat transfer between both principal surfaces of the substrate $1a$ is accelerated, compared to the case where the content of an oxide of aluminum in the substrate $1a$ is equal to or more than that in the granular bodies $1b$. Moreover, when the amount of glass (amorphous material) ingredient constituting the grain boundary phase present in the space between the crystals forming the substrate 1a is small, the dielectric breakdown voltage of the silicon nitride substrate 1 rises, and reliability for the insulating performance may be enhanced.

In particular, the content of an oxide of aluminum in the substrate 1a is preferably 0.1% by mass or less. The content of an oxide of aluminum may be measured by ICP optical emission spectrometry. Specifically, the content of an oxide of aluminum may be measured by, first, identifying an oxide of aluminum by a thin film X-ray diffraction method or with transmission electron microscopy, and converting the content of aluminum, a metal element, obtained by ICP optical emission spectrometry to the content of the oxide of aluminum according to the composition formula that is identified.

The carbon content of the granular bodies 1b in the silicon nitride substrate 1 of the embodiment is preferably 0.05% by mass or less. When the carbon content is 0.05% by mass or less, the content of carbon having electrical conductivity is limited so that leak current is less likely to generate. The content of carbon in the granular bodies 1b may be measured by a carbon analysis method.

The oxygen content of the granular bodies 1b in the silicon nitride substrate 1 of the embodiment is preferably 3.5% by mass or less. By limiting the content of oxygen, formation of foam-like pores when melting the liquid phase (the grain boundary phase) present in the space between the crystals forming the granular bodies 1b may be suppressed. As a result, the amount of ingredients having electrical conductivity such as metal ingredients attached inside the pores may be reduced so that leak current is less likely to generate. The content of oxygen in the granular bodies 1b may be measured by an oxygen analysis method. The content of oxygen in the granular bodies 1b includes not only oxygen present independently, but also oxygen present in the form of metal oxides or oxynitrides.

FIG. 5 schematically shows another example of a silicon nitride substrate of the embodiment: FIG. 5(a) is a plan view, FIG. 5(b) is a cross-sectional view of FIG. 5(a) along the line F-F' and FIG. 5(c) is a partially enlarged view of section G of FIG. 5(b).

In the silicon nitride substrate 1 of the example shown in FIG. 5, a plurality of second needle crystals 1e or second column crystals 1f mainly made of silicon nitride are extended from the principal surface of the substrate 1a, and the diameters of the needle crystals 1c or the column crystals 1d are smaller than those of the second needle crystals 1e or the second column crystals 1f. When the diameters of a plurality of the needle crystals 1c or the column crystals 1d extended from a portion of the granular bodies 1b are smaller than those of a plurality of the second needle crystals 1e or the second column crystals 1f extended from the principal surface of the substrate 1a, the surface area which comes in contact with a brazing material increases so that the anchor effect between the silicon nitride substrate 1 and the brazing material is enhanced, and the silicon nitride substrate 1 and a metal member may even more firmly be bonded, compared to the case where the diameters of the needle crystals 1c or the column crystals 1d are larger than those of the second needle crystals 1e or the second column crystals 1f.

Measurement of each of the diameters of the needle crystals 1c, the column crystals 1d, the second needle crystals 1e and the second column crystals 1f may be conducted as follows. First, a portion of the silicon nitride substrate 1 is cut out and is embedded into a resin, and then the cut-out surface is polished by a cross section polisher method, and a polished surface including the granular bodies 1b is prepared. Then, the polished surface is measured with an optical microscope set at a magnification of 50 times or larger and 1000 times or smaller.

Specifically, 4 areas of, for example, 170 μm×170 μm each, are extracted from the polished surface, then 5 pieces of crystals are selected from each of the needle crystals 1c or the column crystals 1d, and the second needle crystals 1e or the second column crystals 1f for each of the 4 areas, and the diameter of each of the selected crystals is measured at the middle of the extended length. The statement that the diameters of the needle crystals 1c or the column crystals 1d are smaller than those of the second needle crystals 1e or the second column crystals 1f means that the average diameter of the needle crystals 1c or the column crystals 1d is smaller than the average diameter of the second needle crystals 1e or the second column crystals 1f.

In particular, the difference between the average diameter of the needle crystals 1c or the column crystals 1d and the average diameter of the second needle crystals 1e or the second column crystals 1f is preferably 3 μm or more.

In the silicon nitride substrate 1 of the embodiment, the substrate 1a is preferably made of crystals mainly made of silicon nitride and having a smaller average particle diameter than the average particle diameter of crystals made primarily of silicon nitride in the granular bodies 1b. When the substrate 1a is made of crystals mainly made of silicon nitride and having a smaller average particle diameter than the average particle diameter of crystals mainly made of silicon nitride in the granular bodies 1b, the strength of the substrate 1a may be enhanced, compared to the silicon nitride substrate 1 having the same average particle diameter of crystals mainly made of silicon nitride in the substrate 1a and the granular bodies 1b respectively. Thus, even if the silicon nitride substrate 1 of the embodiment with a thin structure is used, such as a support substrate constituting a circuit substrate, the risk of impairing reliability may be reduced. In particular, the average particle diameter of crystals mainly made of silicon nitride in the substrate 1a is preferably 0.5 μm or larger and 14 μm or smaller.

Each of the average particle diameters of crystals in the substrate 1a and in the granular bodies 1b may be measured at a cut-out surface of the silicon nitride substrate 1. Specifically, the average particle diameter of crystals constituting each of the substrate 1a and the granular bodies 1b may be measured in accordance with JIS R 1670-2006 from an area of 100 μm×100 μm extracted from the cut-out surface using an optical microscope set at a magnification of 50 times or larger and 500 times or smaller, provided that the number of crystals of the substrate 1a and the granular bodies 1b measured may be at least 10 pieces each. In the case where the average particle diameter of crystals in each of the substrate 1a and the granular bodies 1b is difficult to measure at the cut-out surface, a polished surface obtained by cutting out a portion of the silicon nitride substrate 1, embedding the portion into a resin and polishing the cut-out surface by a cross section polisher method, may be used.

As for the mechanical properties of the silicon nitride substrate 1, the three point bending strength is preferably 750 MPa or higher, the dynamic modulus of elasticity is preferably 13 GPa or higher, the Vickers hardness ($H_v$) is preferably 13 GPa or higher, and the fracture toughness ($K_{1c}$) is preferably 5 MPam$^{1/2}$ or higher. By setting the mechanical properties in the ranges stated above, a bonded member prepared by bonding the silicon nitride substrate 1 and a metal member may have, in particular, improved creep resistance and heat cycle resistance. Thus, the bonded member has high reliability and is used for a long time.

The three point bending strength may be measured in accordance with JIS R 1601-2008 (ISO 17565: 2003 (MOD)). However, when the silicon nitride substrate 1 has a small thickness and the thickness of a sample cut out from the silicon nitride substrate 1 does not reach 3 mm, the thickness of the silicon nitride substrate 1 will be assessed as the thickness of the sample as it is, and it is desirable that the test results fulfill the figures stated above.

The dynamic modulus of elasticity may be measured in accordance with the ultrasonic pulse method set forth in JIS R 1602-1995. However, when the silicon nitride substrate 1 has a small thickness and the thickness of a sample cut out from the silicon nitride substrate 1 does not reach 10 mm, assessment will be conducted by cantilever resonant frequency analysis, and it is desirable that the test results fulfill the above described value.

However, when the thickness of a silicon nitride sintered body is so small that the above described value cannot be fulfilled by assessing the thickness as it is, the three point bending strength and the dynamic modulus of elasticity may be derived from the sample size and obtained values by calculating formulae.

The Vickers hardness ($H_v$) and the fracture toughness ($K_{1c}$) may be measured in accordance with the indentation fracture method (IF Method) set forth in JIS R 1610-2003 (ISO 14705: 2000 (MOD)) and JIS R 1607-1995, respectively. However, when the silicon nitride substrate 1 has a small thickness and the thickness of a sample cut out from the silicon nitride substrate 1 does not reach 0.5 mm and 3 mm stipulated in the indentation fracture method (IF Method) set forth in JIS R 1610-2003 and JIS R 1607-1995, respectively, the thickness of the silicon nitride substrate 1 will be assessed as the thickness of the sample as it is, and it is desirable that the test results fulfill the above described value. However, when the thickness of the silicon nitride substrate 1 is so small that the above described value cannot be fulfilled by assessing the thickness as it is, for example, when the thickness is 0.2 mm or larger and smaller than 0.5 mm, the Vickers hardness ($H_v$) and the fracture toughness ($K_{1c}$) may be measured with the test force exerted on the silicon nitride substrate 1 of 0.245 N and with the time period of sustaining the test force of 15 seconds.

As for the electrical properties of the above described silicon nitride substrate 1, the volume resistivity is preferably $10^{14}$ Ω·cm or higher at room temperature, and $10^{12}$ Ω·cm or higher at 300° C. The volume resistivity may be measured in accordance with JIC C 2141-1992. However, when the silicon nitride substrate 1 is small and cannot be enlarged to a size set forth in JIC C 2141-1992, assessment shall be conducted by the 2-terminal method, and it is desirable that the test results fulfill the figures stated above.

Figure 6:
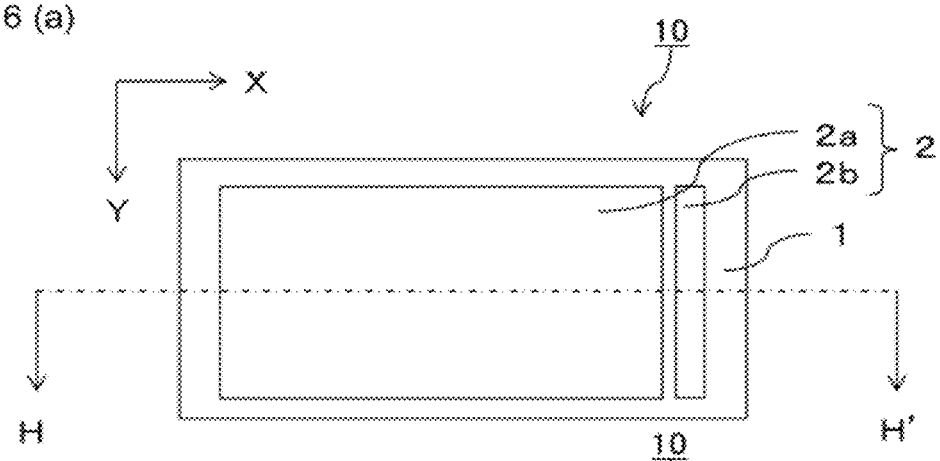
FIG. 6 shows an example of a circuit substrate of the embodiment.
Figure 6:
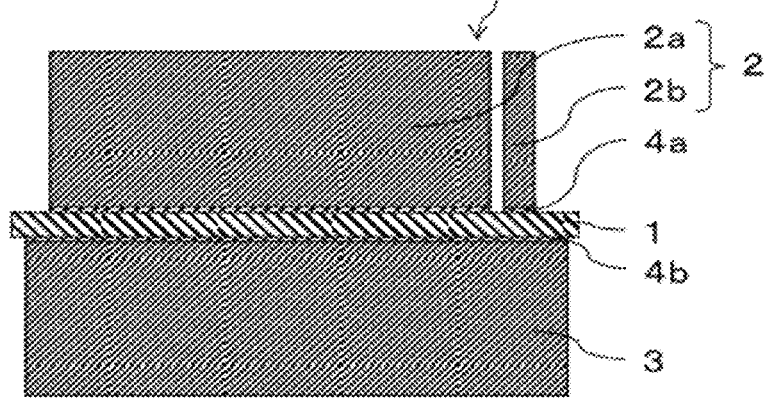
Figure 6:
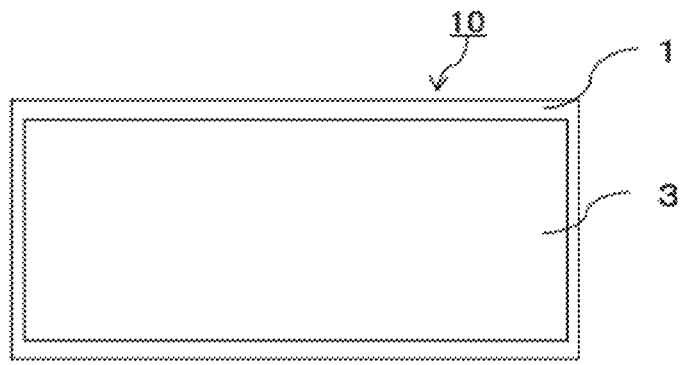

FIG. 6 shows an example of a circuit substrate of the embodiment: FIG. 6(a) is a plan view, FIG. 6(b) is a cross-sectional view of FIG. 6(a) along the line H-H' and FIG. 6(c) is a bottom view.

A circuit substrate 10 of the example shown in FIG. 6 is the circuit substrate 10, in which a circuit member 2 made of a metal is bonded to one principal surface of a support substrate (hereinafter, the support substrate is numbered as support substrate 1) made of the silicon nitride substrate 1 of the embodiment, and a heat radiation member 3 made of a metal is bonded to the other principal surface of the support substrate 1, through a brazing material 4a and a brazing material 4b, respectively. The circuit substrate 10 uses the support substrate 1 made of a silicon nitride substrate of the embodiment which produces a high anchor effect, thus adhesion of the brazing materials 4a and 4b to the support substrate 1 is enhanced so that the support substrate 1, and the circuit member 2 and the heat radiation member 3 may be firmly bonded.

The support substrate 1 constituting the circuit substrate 10 of the embodiment has a flat plate configuration and has, for example, a length (as measured in the X-direction as shown in FIG. 6) of 20 mm or more and 200 mm or less, and a width (as measured in the Y-direction as shown in FIG. 6) of 10 mm or more and 120 mm or less. The thickness of the support substrate 1 may vary according to its application, however, in order to maintain high durability and dielectric strength voltage, and to suppress resistance to heat, the thickness is preferably 0.2 mm or more and 1.0 mm or less.

A circuit member 2a constituting the circuit substrate 10 of the embodiment has, for example, a length (as measured in the X-direction as shown in FIG. 6) of 15 mm or more and 155 mm or less, and a width (as measured in the Y-direction as shown in FIG. 6) of 8 mm or more and 100 mm or less. A circuit member 2b has, for example, a length (as measured in the X-direction as shown in FIG. 6) of 1 mm or more and 10 mm or less, and a width (as measured in the Y-direction as shown in FIG. 6) of 8 mm or more and 100 mm or less. Each of the thickness of the circuit members 2a and 2b depends on factors such as the magnitude of electrical current flowing through the circuit members 2a and 2b, and the amount of heat generated by electronic components (not shown in FIG. 6) mounted on the circuit members 2a and 2b, and is, for example, 0.5 mm or more and 5 mm or less.

The heat radiation member 3 constituting the circuit substrate 10 assumes the function of releasing heat from heated electronic components (not shown in FIG. 6), and has, for example, a length (as measured in the X-direction as shown in FIG. 6) of 18 mm or more and 190 mm or less, a width (as measured in the Y-direction as shown in FIG. 6) of 8 mm or more and 100 mm or less and a thickness of 0.5 mm or more and 5 mm or less.

The circuit member 2 and the heat radiation member 3 made of a metal are members made of a metal having high thermal conductivity such as copper or aluminum.

FIG. 7 shows another example of a circuit substrate of the embodiment: FIG. 7(a) is a plan view, FIG. 7(b) is a cross-sectional view of FIG. 7(a) along the line I-I' and FIG. 7(c) is a bottom view.

The circuit substrate 10 of the example shown in FIG. 7 is the circuit substrate 10, in which the circuit member 2 made of a metal is bonded to one principal surface of the support substrate 1 made of a silicon nitride substrate, and the heat radiation member 3 made of a metal is bonded to the other principal surface of the support substrate 1, through the brazing materials 4a and 4b and intermediate materials 5a and 5b made of a metal, respectively, in sequence starting from the side of the support substrate 1. The circuit substrate 10 of the example shown in FIG. 7 is capable of producing similar function and effect as the circuit substrate 10 of the example shown in FIG. 6. In the circuit substrate 10 of the example shown in FIG. 6, when the circuit member 2 and the heat radiation member 3 are mainly made of copper, a bonding temperature of 800 to 900° C. is required. However, by using a mediation of copper as the intermediate materials 5a and 5b made of a metal, bonding between the circuit member 2 and the intermediate material 5a and between the heat radiation member 3 and the intermediate material 5b may be attained at a relatively low temperature because copper, which is the constituting ingredient of each of the intermediate materials 5a and 5b, diffuses at around 300 to 500° C. Thus, warpage produced in the support substrate 1 may be suppressed. As a result, at least one of the circuit member 2 and the heat radiation member 3 may be made thick and the heat radiating property may be enhanced.

Meanwhile, the length, width and thickness of each of the support substrate 1, the circuit members 2a and 2b, and the heat radiation member 3 constituting the circuit substrate 10 of the example shown in FIG. 7 are the same as the length, width and thickness of each of the support substrate 1, the circuit members 2a and 2b, and the heat radiation member 3 constituting the circuit substrate 10 of the example shown in FIG. 6.

FIG. 8 shows another example of a circuit substrate of the embodiment: FIG. 8(a) is a plan view, FIG. 8(b) is a cross-sectional view of FIG. 8(a) along the line J-J' and FIG. 8(c) is a bottom view.

The circuit substrate 10 of the example shown in FIG. 8 is the circuit substrate 10, in which the circuit member 2 made of a metal is bonded to one principal surface of the support substrate 1 made of a silicon nitride substrate, and the heat radiation member 3 made of a metal is bonded to the other principal surface of the support substrate 1, through the brazing materials 4a and 4b and the intermediate materials 5a and 5b, respectively, in sequence starting from the side of the support substrate 1. In the example shown in FIG. 8, the circuit members 2a and 2b lined up side by side have the same size, and the dimensions of the circuit members 2a and 2b are, for example, a length (as measured in the X-direction as shown in FIG. 8) of 8 mm or more and 85 mm or less, a width (as measured in the Y-direction as shown in FIG. 8) of 8 mm or more and 100 mm or less and a thickness of 0.5 mm or more and 5 mm or less. The length, width and thickness of each of the support substrate 1 and the heat radiation member 3 of the example shown in FIG. 8 are the same as the length, width and thickness of each of the support substrate 1 and the heat radiation member 3 constituting the circuit substrate 10 of the examples shown in FIGS. 6 and 7.

As in the example shown in FIG. 8, when the circuit members 2a and 2b having the same size are arranged on one principal surface of the support substrate 1, stress strain produced in the support substrate 1 in bonding may be reduced compared to the case of the circuit substrate 10 in the example shown in FIG. 7, thus warpage of the support substrate 1 developed during the course of preparing the circuit substrate 10 may be suppressed.

The circuit member 2 and the heat radiation member 3 made of a metal are preferably made of copper having a copper content of 90% by mass or more. The circuit member 2 and the heat radiation member 3 are preferably made of any one of oxygen free copper, tough pitch copper and phosphorous deoxidized copper which are rich in copper content. In particular, among the oxygen free coppers, any one of linear crystal oxygen free copper, high purity single crystal oxygen free copper and vacuum melting copper having a copper content of 99.995% by mass or higher is preferable. When the copper content in the circuit member 2 and the heat radiation member 3 is high, electric resistance becomes low and thermal conductivity becomes high, and heat radiation property is improved. Specifically in the circuit member 2, the circuit characteristics, i.e., the characteristics of suppressing heat generation from electronic components mounted on the circuit member 2 and reducing electric power loss, is improved. Moreover, when the content of copper is high, yield stress becomes low and plastic deformation readily occurs upon heating. Thus, when copper is used in the intermediate materials 5a and 5b, adhesion between the circuit member 2 and the intermediate material 5a, and between the heat radiation member 3 and the intermediate material 5b respectively will be strengthened and reliability may be enhanced.

The brazing materials 4a and 4b are mainly made of at least either of silver and copper, and preferably contain one or more elements selected from titanium, zirconium, hafnium and niobium. The thickness of the brazing materials 4a and 4b is such that they may cover the granular bodies integrated with a principal surface of the support substrate 1. Furthermore, the brazing materials 4a and 4b preferably contain one or more elements selected from molybdenum, tantalum, osmium, rhenium and tungsten.

The intermediate materials 5a and 5b made of copper are preferably made of any one of oxygen free copper, tough pitch copper and phosphorous deoxidized copper which are rich in copper content. In particular, among the oxygen free coppers, any one of linear crystal oxygen free copper, high purity single crystal oxygen free copper and vacuum melting copper having a copper content of 99.995% by mass or higher is preferable. The thickness of the intermediate materials 5a and 5b is, for example, 0.1 mm or more and 0.6 mm or less.

The three point bending strength, the dynamic modulus of elasticity, the Vickers hardness ($H_v$) and the fracture toughness ($K_{1c}$) of the support substrate 1 made of the silicon nitride substrate constituting the circuit substrate 10 may be measured by the above described methods after removing the brazing materials 4a and 4b, and the intermediate materials 5a and 5b from the circuit substrate 10 by way of etching.

Figure 9:
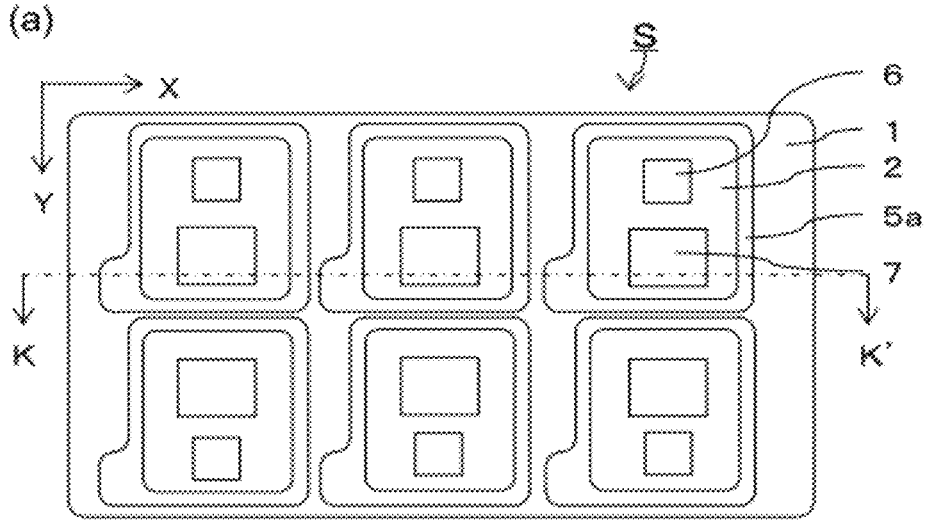
FIG. 9 shows an example of an electronic device of the embodiment.
Figure 9:
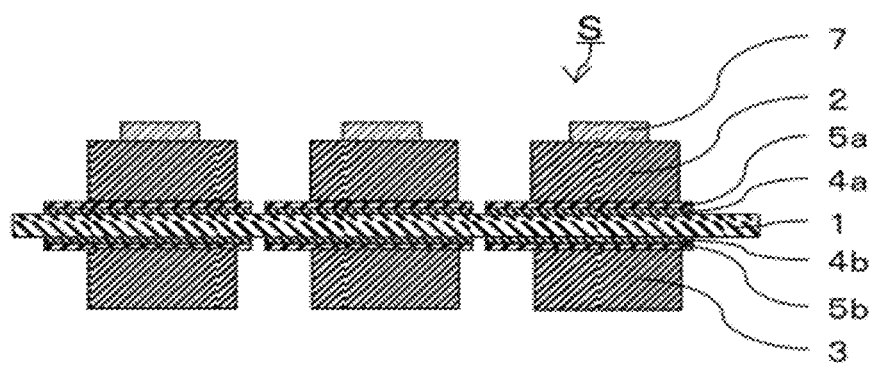
Figure 9:
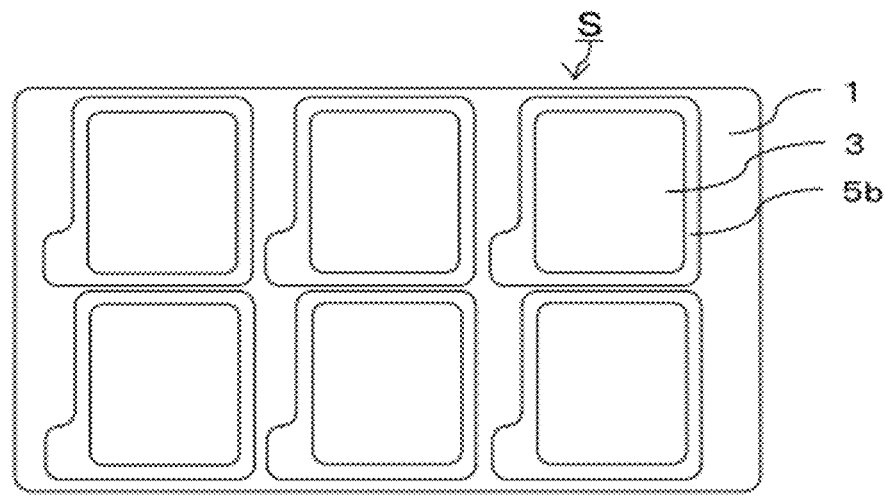

FIG. 9 shows an example of an electronic device of the embodiment: FIG. 9(a) is a plan view, FIG. 9(b) is a cross-sectional view of FIG. 9(a) along the line K-K' and FIG. 9(c) is a bottom view.

An electronic device S of the example shown in FIG. 9 is an electronic device, in which electronic components 6 and 7 of one or more semiconductor devices and the like are mounted on the circuit member 2 on the circuit substrate 10 of the embodiment. These electronic components 6 and 7 are electrically connected with each other by an electric conductor (not shown in FIG. 9). According to the electronic device S of the embodiment, the electronic components 6 and 7 are mounted on the circuit member 2 on the circuit substrate 10 of the embodiment, and even if the electronic components 6 and 7 repeatedly generate heat, the support substrate 1, and the circuit member 2 and the heat radiation member 3 will not easily detach from each other. Thus, the electronic device S can be made highly durable.

The dimensions of the support substrate 1 of the example shown in FIG. 9 are preferably, for example, a length (as measured in the X-direction as shown in FIG. 9) of 20 mm or more and 200 mm or less, a width (as measured in the Y-direction as shown in FIG. 9) of 10 mm or more and 120 mm or less and a thickness of 0.2 mm or more and 1.0 mm or less. The dimensions of the circuit member 2 and the heat radiation member 3 are preferably, for example, a length (as measured in the X-direction as shown in FIG. 9) of 4 mm or more and 40 mm or less, a width (as measured in the Y-direction as shown in FIG. 9) of 5 mm or more and 50 mm or less and a thickness of 0.5 mm or more and 5 mm or less.

As in the example shown in FIG. 9 in a planar view, the circuit members 2 and the heat radiation members 3 are preferably arranged in a plurality of lines and in a plurality of columns. By arranging the circuit members 2 and the heat radiation members 3 in a plurality of lines and in a plurality of columns as shown in a planar view, stress produced in the support substrate 1 is likely to be dispersed when bonding the circuit members 2 and the heat radiation members 3 to the support substrate 1, thus warpage of the support substrate 1 may be suppressed.

In particular, as in the example shown in a planar view in FIG. 9, the circuit members 2 and the heat radiation members 3 are preferably arranged in a plurality of lines and in a plurality of columns at equal intervals respectively.

Moreover, the silicon nitride substrate 1 of the embodiment may be used in the support substrate 1 constituting a thermoelectric conversion module.

Figure 10:
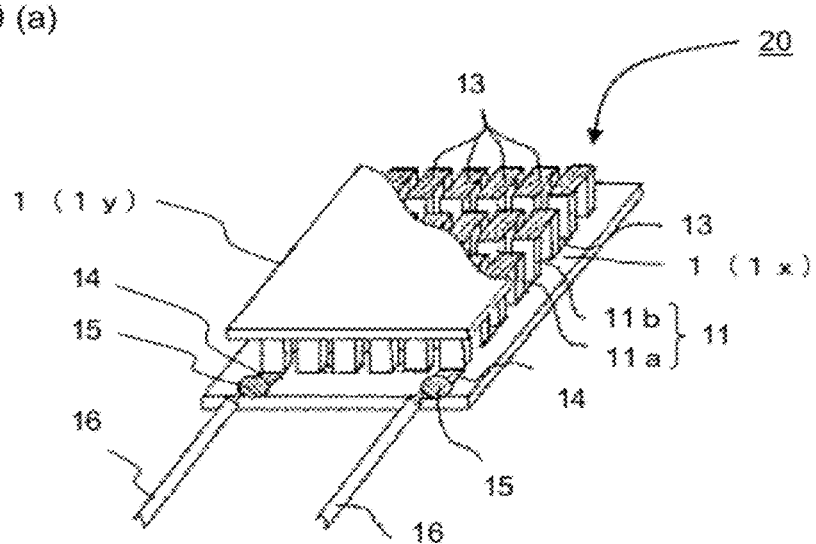
FIG. 10 shows an example of a thermoelectric conversion module of the embodiment.
Figure 10:
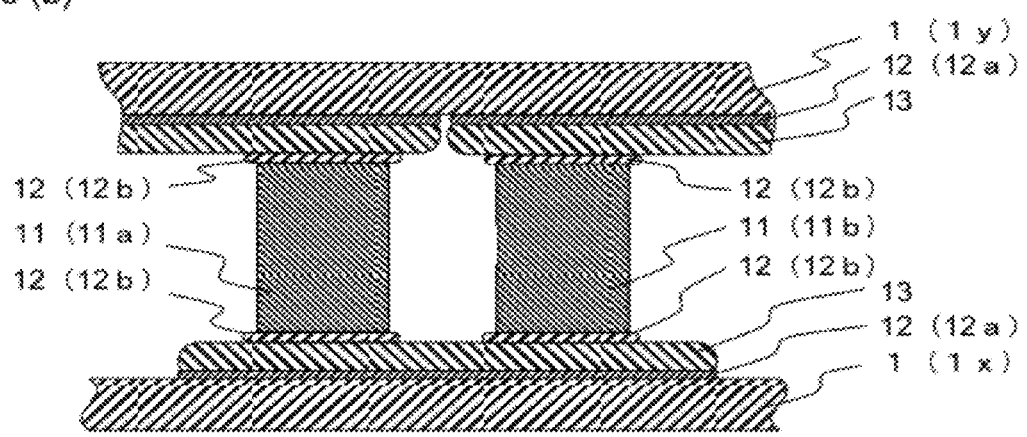

FIG. 10 shows an example of a thermoelectric conversion module of the embodiment: FIG. 10(a) is a partially broken perspective view and FIG. 10(b) is a cross-sectional view. In the following explanation, each member will be described with reference numerals. However, an alphabet will be shown next to each numeral when individual configurations in the same member are to be shown.

A thermoelectric conversion module 20 shown in FIG. 10 is a thermoelectric conversion module, in which thermoelectric conversion devices 11 made of p type thermoelectric conversion devices 11a and n type thermoelectric conversion devices 11b are arranged between support substrates 1x and 1y facing each other, in which the thermoelectric conversion devices 11 are bonded to the support substrate 1, mediated sequentially from the side of the support substrate 1 by a bonding layer 12 (12a), wiring conductors 13 and second bonding layers 12 (12b), the respective thermoelectric conversion devices 11 are electrically connected in a series.

When a silicon nitride substrate of the embodiment is used as the support substrates 1x and 1y, because a plurality of granular bodies 1b containing silicon are integrated to principal surfaces of the support substrates 1x and 1y and a plurality of needle crystals or column crystals mainly made of silicon nitride are extended from a portion of the granular bodies 1b, a high anchor effect may be produced by the needle crystals or the column crystals between the support substrate 1 and a brazing material when bonding the substrate 1 and the wiring conductors 13 by heating. Thus, the substrate 1 and the wiring conductors 13 may be firmly bonded.

Next, a method for preparing a silicon nitride substrate of the embodiment will be described below.

First, a powder of silicon nitride with a betalization degree of 20% or lower, and, as an additive ingredient, at least one of a powder of either magnesium oxide (MgO) and calcium oxide (CaO) and a powder of an oxide of a rare earth element, for example, at least any one of $Sc_2O_3$, $Y_2O_3$, $La_2O_3$, $Ce_2O_3$, $Pr_6O_{11}$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$ are wet-mixed using a barrel mill, a tumbling mill, a vibrating mill, a beads mill, a sand mill, an agitator mill or the like. The mixture is pulverized and is made into a slurry.

If the total sum of the powder of silicon nitride and the sum of powders of the additive ingredients is 100% by mass, then either of an additive ingredient of a powder of magnesium oxide (MgO) or a powder of calcium oxide (CaO) may be 2 to 7% by mass, and a powder of an oxide of a rare earth element, for example, at least any one of $Sc_2O_3$, $Y_2O_3$, $La_2O_3$, $Ce_2O_3$, $Pr_6O_{11}$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$ may be 7 to 16% by mass.

Incidentally, there are two types of silicon nitrides, namely an α-type and a β-type, depending on the difference in their crystal structures. The α-type is stable at low temperature and the β-type is stable at high temperature, and phase transition from the α-type to the β-type occurs irreversibly at 1400° C. or more. The betalization degree here is the value obtained by the following formula:

betalization degree=$\{I_\beta/(I_\alpha+I_\beta)\} \times 100(\%)$, wherein $I_\alpha$ is the sum of the peak strength of an α (102) diffraction line and that of an α (210) diffraction line obtained by the x-ray diffraction method, and $I_\beta$ is the sum of the peak strength of a β (101) diffraction line and that of a β (210) diffraction line.

The betalization degree of a silicon nitride powder affects the strength of a silicon nitride sintered body and the value of fracture toughness. The reason for using a powder of silicon nitride with a betalization degree of 20% or lower is because it allows both the strength and the value of fracture toughness to be enhanced. A powder with a betalization degree of higher than 20% is likely to become a core of grain growth during a calcining step, and to become a coarse crystal having a small aspect ratio, causing both the strength and the value of fracture toughness to be lowered. Thus, a powder of silicon nitride with a betalization degree of 10% or lower is preferably used.

Balls used in pulverizing powders of silicon nitride and additive ingredients are preferably balls made of materials less likely to include impurities or of the same material composition as a silicon nitride sintered body. From the viewpoint of improving sinterability and of column or needle crystal structures, pulverization of powders of silicon nitride and additive ingredients is preferably conducted to the extent so that, when the total sum of cumulative volume in a particle size distribution curve is defined to be 100%, the particle diameter ($D_{90}$), when the cumulative volume is 90%, is 3 μm or less. The particle size distribution obtained by pulverization may be conditioned by the outside diameter of the balls, the amount of the balls, the viscosity of the slurry, the duration of pulverizing and others. In order to reduce the viscosity of the slurry, a dispersing agent is preferably added, and in order to pulverize the powder in a short time, a powder with a particle diameter ($D_{50}$), when the cumulative volume is 50%, of 1 μm or less is preferably used.

Next, the resultant slurry is passed through a sieve having a smaller mesh than a mesh having a particle size number of 200 set forth in ASTM E 11-61, and is dried to obtain granules (hereinafter referred to as "silicon nitride granules") mainly made of silicon nitride. Drying may be conducted with a spray dryer, or it may be done in other methods without any problem. The silicon nitride granules are molded into a sheet-like configuration of ceramic green sheet by a powder rolling method. The ceramic green sheet is cut into a given length and a silicon nitride body is obtained.

Subsequently, a plurality of powder/granular bodies such as granules, a placing powder and others containing silicon are mounted on a principal surface of the silicon nitride body. The methods for the mounting include sprinkling with a sieve or the like, or application with a brush or a roller a slurry prepared by adding a solvent or others to the powder/granular bodies. The powders constituting the powder/granular bodies are, for example, at least one of a powder of silicon, a powder of silicon nitride, a powder of silicon oxide and a powder of sialon, at least either one of a powder of magnesium oxide (MgO) or calcium oxide (CaO) as an additive ingredient, and a powder of an oxide of a rare earth element. Granules are obtained by, for example, drying with a spray dryer a slurry prepared by mixing the powders stated above and pulverizing the mixture. A placing powder is a powder, among others, obtained by pulverizing a sintered body prepared by calcining the above described powders.

In order to integrate the granular bodies 1b in a hemisphere against the principal surface of the substrate 1a, spherical granules may be used. In order to arrange the granular bodies 1b in a plurality of lines, the mounting may be conducted using a roller or the like which enables to arrange powder/granular bodies in a plurality of lines. The distance between two adjoining powder/granular bodies may be, for example, 0.125 mm or more and 0.625 mm or less.

In order to make the density of the granular bodies 1b on a principal surface of the substrate 1a to be 48 pieces/cm² or more and 502 pieces/cm² or less, the density of powder/granular bodies on a principal surface of a silicon nitride body may be made to be 31 pieces/cm² or more and 321 pieces/cm² or less.

In order to make the diameters of the needle crystals 1c or the column crystals 1d smaller than those of the second needle crystals 1e or the second column crystals 1f, the contents of the additive ingredients constituting the granular bodies 1b may be made less than those in the substrate 1a.

In order to make the substrate 1a be constituted with crystals mainly made of silicon nitride having a smaller average particle diameter than the average particle diameter of crystals constituting the granular bodies 1b, the average particle diameter of a powder of silicon nitride which is the main ingredient of the substrate 1a may be made to be smaller than the average particle diameter of a powder selected from a powder of silicon, a powder of silicon nitride, a powder of silicon oxide and a powder of sialon which are materials for the granular bodies 1b. For example, the average particle diameter of a powder of silicon nitride which is the main ingredient of the substrate 1a may be made to be 0.7 µm or larger and 1 µm or smaller, and the average particle diameter of a powder selected from a powder of silicon, a powder of silicon nitride, a powder of silicon oxide and a powder of sialon which are materials for the granular bodies 1b may be made to be 5 µm or larger and 10 µm or smaller.

In order to make the granular bodies 1b contain an oxide of aluminum, an ingredient to make an oxide of aluminum may be added to a powder constituting powder/granular bodies. Moreover, in order to make the content of an oxide of aluminum in the silicon nitride substrate 1 less than that in the granular bodies 1b, the amount of aluminum in a powder constituting the powder/granular bodies and that in a material powder for the silicon nitride substrate 1 may be conditioned.

In order to obtain the granular bodies 1b having a content of carbon of 0.05% by mass or less, powder/granular bodies having a content of carbon of 0.05% by mass or less may be used. In order to obtain the granular bodies 1b having a content of oxygen of 3.5% by mass or less, powder/granular bodies having a content of oxygen of 3.5% by mass or less may be used.

Then, a plurality of silicon nitride bodies mounted with powder/granular bodies on their principal surfaces are piled together. The pile in this state is placed inside a calcining furnace installed with a graphite resistance heating element, and the pile is calcined.

In order to suppress the volatilization of ingredients contained in the silicon nitride body, common materials containing ingredients such as magnesium oxide and an oxide of a rare earth element may be placed in the calcining furnace. The temperature is raised from room temperature to 300 to 1000° C. in a vacuum atmosphere, and then, nitrogen gas is introduced into the furnace and a partial pressure of nitrogen of 15 to 300 kPa is maintained. The open porosity of the silicon nitride body in this state is in the order of 40 to 55%, thus nitrogen gas is sufficiently filled in the silicon nitride body. At around 1000 to 1400° C., additive ingredients form a liquid phase ingredient via a solid phase reaction, and in a temperature range of 1400° C. or higher, irreversible phase transition from the α-type to the β-type occurs. By further raising the temperature in the furnace to 1700° C. or higher and lower than 1800° C. and keeping the temperature for 4 hours or more and 10 hours or less, the silicon nitride substrate 1, in which a plurality of granular bodies 1b containing silicon are integrated to a principal surface of the substrate, and in which a plurality of the needle crystals 1c or the column crystals 1d are extended from a portion of the granular bodies 1b due to growth of crystal grains mainly made of silicon nitride, may be obtained.

Next, a method for preparing a circuit substrate of the embodiment will be described below.

In order to obtain the circuit substrate 10 of the embodiment of the example shown in FIG. 6, first, the support substrate 1 made of a silicon nitride substrate having a length in the X-direction of 20 mm or more and 200 mm or less, a length in the Y-direction of 10 mm or more and 120 mm or less and a thickness of 0.2 mm or more and 1.0 mm or less, is prepared. Then, on both principal surfaces of the support substrate 1, a paste-like brazing material of a silver (Ag)-copper (Cu) alloy containing one or more elements selected from titanium, zirconium, hafnium and niobium, is applied by any one of a screen printing method, a roll coater method, a brush painting method and the like. Then, the circuit member 2 mainly made of copper is arranged on one principal surface, and the heat radiation member 3 mainly made of copper is arranged on the other principal surface. The paste-like brazing material stated above may contain one or more elements selected from molybdenum, tantalum, osmium, rhenium and tungsten. Then, the resulting set is heated at 800° C. or higher and 900° C. or lower, and the circuit substrate 10 having the circuit member 2 bonded to one principal surface of the support substrate 1, and the heat radiation member 3 bonded to the other principal surface through the brazing materials 4a and 4b, respectively, is obtained.

In order to obtain the circuit substrate 10 of the embodiment of the examples shown in FIGS. 7 and 8, first, the above described support substrate 1 having dimensions is prepared. Then, on both principal surfaces of the support substrate 1, a paste-like brazing material of a silver (Ag)-copper (Cu) alloy containing one or more elements selected from titanium, zirconium, hafnium and niobium, is applied by any one of a screen printing method, a roll coater method, a brush painting method and the like, followed by arranging the intermediate materials 5a and 5b made of thin shaped copper on both sides. The paste-like brazing material may contain one or more elements selected from molybdenum, tantalum, osmium, rhenium and tungsten. Then, the resulting set is heated at 800° C. or higher and 900° C. or lower, and the brazing material 4a and the intermediate material 5a are formed on one principal surface of the support substrate 1, and the brazing material 4b and the intermediate material 5b made of copper are formed on the other principal surface. Then, the surfaces of the intermediate materials 5a and 5b made of copper facing the circuit member 2 and the heat radiation member 3 respectively are polished, followed by arranging the circuit member 2 and the heat radiation member 3 on the intermediate materials 5a and 5b made of copper respectively. Then, the resulting set is heated to 300 to 500° C. in an atmosphere of an element selected from hydrogen, nitrogen, neon and argon, under a pressure of 30 MPa or more. Consequently, the circuit substrate 10 is obtained, in which the circuit member 2 is bonded to one principal surface of the support substrate 1, and the heat radiation member 3 is bonded to the other principal surface through the brazing materials 4a and 4b, and the intermediate materials 5a and 5b made of copper respectively.

By mounting electronic components on the circuit member 2 of the circuit substrate 10, the electronic device of the embodiment is obtained.

Hereinafter, examples of the embodiment are specifically described, however, the present invention shall not be limited by the examples.

EXAMPLE 1

A powder of silicon nitride with a betalization degree of 10%, i.e., an alphalization degree of 90%, and, as additive ingredients, a powder of magnesium oxide (MgO) and a powder of erbium oxide ($Er_2O_3$) were wet-mixed with a tumbling mill, and were pulverized, until the particle diameter ($D_{90}$) was reduced to 1 µm or less, and were made into a slurry.

If the total sum of the powder of silicon nitride and the sum of powders of the additive ingredients is defined to be 100% by mass, then the powder of magnesium oxide (MgO) and the powder of erbium oxide ($Er_2O_3$) as additive ingredients were 5% by mass and 10% by mass, respectively.

Then, the resultant slurry was passed through a sieve having a mesh of a particle size number of 250 set forth in ASTM E 11-61, and then was dried with a spray dryer to obtain silicon nitride granules. The silicon nitride granules were molded into a sheet-like configuration of ceramic green sheet by a powder rolling method. The ceramic green sheet was cut into a given length and a silicon nitride body was obtained.

Then, granules which are powder/granular bodies mainly made of silicon nitride and, as additive ingredients, magnesium oxide (MgO) and erbium oxide ($Er_2O_3$) in amounts shown in Table 1 were prepared by the same method as the above described method. In order to differentiate the densities of powder/granular bodies on a principal surface of a silicon nitride body, powder/granular bodies were mounted on a principal surface of each sample of a silicon nitride body using rollers having different surface configurations. Then, an area of 170 µm×170 µm was selected from the principal surface of a silicon nitride body, and the number of powder/granular bodies in the area was counted with an optical microscope set at a magnification of 800 times, and the density of powder/granular bodies per 1 $cm^2$ was calculated.

Then, a plurality of silicon nitride bodies mounted with powder/granular bodies on their principal surfaces were piled together for each sample, and the pile in this state was placed inside a calcining furnace installed with a graphite resistance heating element, and the pile was calcined. In order to suppress the volatilization of ingredients contained in the silicon nitride body, a common material containing magnesium oxide (MgO) and erbium oxide ($Er_2O_3$) was placed in the calcining furnace. The temperature was raised from room temperature to 500° C. in a vacuum atmosphere, and then, nitrogen gas was introduced into the furnace and a partial pressure of nitrogen of 30 kPa was maintained. The temperature inside the calcining furnace was further raised to 1750° C. and was maintained for a period of time shown in Table 1 to prepare a silicon nitride substrate having a length of 60 mm, a width of 30 mm and a thickness of 0.32 mm.

Then, an area of 170 µm×170 µm was selected from a principal surface of the substrate 1a, and the number of the granular bodies 1b in the area was counted with an optical microscope set at a magnification of 800 times, and the density of the granular bodies 1b per 1 $cm^2$ was calculated.

The diameter of each of the needle crystals 1c, the column crystals 1d, the second needle crystals 1e and the second column crystals 1f was measured. Specifically, a portion of the silicon nitride substrate was first cut out and was embedded into a resin, and the cut-out surface was polished by a cross section polisher method, and thus a polished surface including the granular bodies 1b was prepared. Specifically, a scanning type electron microscope sample preparation equipment (cross section polisher, SM-09010 manufactured by JEOL Ltd.) was used, the acceleration voltage of irradiated argon ions was 6 kV, the flow rate of argon gas was controlled so that the flow rate was 70 to 80% of the maximum value of electric current of detected argon ions and the polishing time duration was 8 hours.

Then, using an optical microscope set at a magnification of 800 times, 4 areas of 170 µm×170 µm each were extracted from the polished surface stated above. Next, 5 pieces of crystals were selected from each of the needle crystals 1c or the column crystals 1d, and the second needle crystals 1e or the second column crystals 1f for each of the 4 areas, and the diameter of each of the selected crystals was measured at the middle of the extended length. The average diameter of the needle crystals 1c or the column crystals 1d and the average diameter of the second needle crystals 1e or the second column crystals 1f were calculated. These conversion values and calculated values are shown in Table 1.

Then, each sample of silicon nitride substrate was used as the support substrate 1, and as shown in FIG. 8, the paste-like brazing materials 4a and 4b were applied by screen printing on the portions where the circuit members 2a and 2b were to be arranged on one principal surface of the support substrate 1, and on the portion where the heat radiation member 3 was to be arranged on the other principal surface of the support substrate 1, and then the applied paste-like brazing materials 4a and 4b were dried at 135° C.

The applied brazing materials 4a and 4b are mainly made of silver and copper, and further contain, as additive ingredients, titanium, molybdenum and indium, and the contents of silver, copper, titanium, molybdenum and indium were 53.0% by mass, 38.8% by mass, 2.4% by mass, 2.9% by mass and 2.9% by mass, respectively.

The intermediate materials 5a and 5b made of oxygen free copper were arranged so that they were in contact with the brazing materials 4a and 4b, respectively, and were heated at 840° C. in a vacuum atmosphere.

The surfaces of the intermediate materials 5a and 5b facing the circuit members 2a and 2b, and the heat radiation member 3 were polished respectively. Then, the circuit members 2a and 2b, and the heat radiation member 3 were arranged as shown in FIG. 8, and were pressure-bonded to the intermediate materials 5a and 5b respectively in a hydrogen atmosphere, at a consistent temperature of 400° C., and under a pressure of 30 MPa or more. After the pressure bonding was complete, while keeping the pressure as it was, the temperature was reduced to 50° C. at which copper would not oxidize. The object was pulled out, and the circuit substrate 10 was obtained, in which the circuit members 2a and 2b, and the heat radiation member 3 were bonded to the support substrate 1 while sequentially mediated by the brazing materials 4a and 4b, and the intermediate materials 5a and 5b.

The circuit members 2a and 2b were each in a square configuration with a side length of 24 mm and a thickness of 2 mm, and the distance between the circuit member 2a and the circuit member 2b was 2 mm. The heat radiation member 3 had a length of 58 mm, a width of 26 mm and a thickness of 2 mm. The brazing materials 4a and 4b had configurations that matched the configurations of the circuit members 2a and 2b, and the heat radiation member 3 respectively, and had a thickness that was able to cover the granular bodies 1b. The intermediate materials 5a and 5b had configurations that matched the configurations of the circuit members 2a and 2b, and the heat radiation member 3 respectively, and had a thickness of 0.35 mm, respectively.

The peel strength (kN/m) of the circuit member 2a was measured in accordance with JIS C 6481-1996, and the bond strength between the circuit member 2a and the support substrate 1 was assessed. The values of peel strength of the circuit member 2a are shown in Table 1. Samples used to measure the peel strength were prepared by cutting off both ends of the circuit member 2a having a square shape of a side length of 24 mm in the X-direction by etching, thus making the circuit member 2a to be 10 mm×24 mm.

TABLE 1

| Sample No. | Content of powder/granular bodies (mass %) | | | Density of power/granular bodies (pieces/cm²) | Retention time (hour) | Density of granular bodies (pieces/cm²) | Average diameter of needle crystals or column crystals (μm) | Average diameter of second needle crystals or second column crystals (μm) | Peel strength (kN/m) |
|---|---|---|---|---|---|---|---|---|---|
| | Magnesium oxide (MgO) | Erbium oxide (Er₂O₃) | Total | | | | | | |
| 1  | 1 | 1  | 2  | 29  | 3 | 45  | —   | 3   | 12.7 |
| 2  | 1 | 1  | 2  | 29  | 5 | 45  | 0.2 | 3.2 | 21.1 |
| 3  | 1 | 1  | 2  | 31  | 5 | 48  | 0.2 | 3.2 | 23.4 |
| 4  | 1 | 1  | 2  | 46  | 5 | 72  | 0.2 | 3.2 | 25.8 |
| 5  | 1 | 1  | 2  | 65  | 5 | 102 | 0.2 | 3.2 | 27.4 |
| 6  | 1 | 1  | 2  | 164 | 5 | 256 | 0.2 | 3.2 | 29.0 |
| 7  | 5 | 10 | 15 | 164 | 5 | 256 | 3.2 | 3.2 | 26.4 |
| 8  | 1 | 1  | 2  | 287 | 5 | 448 | 0.2 | 3.2 | 26.0 |
| 9  | 1 | 1  | 2  | 301 | 5 | 470 | 0.2 | 3.2 | 25.3 |
| 10 | 1 | 1  | 2  | 321 | 5 | 502 | 0.2 | 3.2 | 22.7 |
| 11 | 1 | 1  | 2  | 325 | 5 | 508 | 0.2 | 3.2 | 21.6 |

As shown in Table 1, sample No. 1 had a short time duration of being maintained at 1750° C. when calcined, and the needle crystals 1c or the column crystals 1d mainly made of silicon nitride extended from a portion of the granular bodies 1b could not be recognized. Thus, the value of peel strength of the circuit member 2a was small, and the bond strength between the circuit member 2a and the support substrate 1 was low.

On the other hand, samples No. 2 to 11 had a plurality of the needle crystals 1c or the column crystals 1d mainly made of silicon nitride extended from a portion of the granular bodies 1b. Thus, the values of peel strength of the circuit member 2a were large, and the bond strengths between the circuit member 2a and the support substrate 1 were high.

Samples No. 3 to 10 had densities of the granular bodies 1b of 48 pieces/cm² or more and 502 pieces/cm² or less, thus the values of peel strength of the circuit member 2a were large, and the bond strengths between the circuit member 2a and the support substrate 1 were high, compared to those of samples No. 2 and 11 which had densities of the granular bodies 1b out of the above described range. In particular, samples No. 5 to 8 having densities of the granular bodies 1b of 102 pieces/cm² or more and 448 pieces/cm² or less had much larger values of peel strength of the circuit member 2a and much higher bond strengths between the circuit member 2a and the support substrate 1 than others did.

Comparing sample No. 6 with sample No. 7, sample No. 6 had a plurality of the second needle crystals 1e or the second column crystals 1f mainly made of silicon nitride extended from a principal surface of the substrate 1a, and the needle crystals 1c or the column crystals 1d had smaller diameters than those of the second needle crystals 1e or the second column crystals 1f. Meanwhile, sample No. 7 had a plurality of the needle crystals 1c or the column crystals 1d having the same diameters as those of a plurality of the second needle crystals 1e or the second column crystals 1f. Thus, sample No. 6 exhibited a larger value of peel strength of the circuit member 2a and a higher bond strength between the circuit member 2a and the support substrate 1 than those exhibited by sample No. 7.

EXAMPLE 2

First, a silicon nitride body was prepared by the same method as the method described in Example 1.

Powder/granular bodies made of powders mainly made of silicon nitride and, as additive ingredients, magnesium oxide (MgO) and erbium oxide (Er₂O₃) were mounted on a principal surface of a silicon nitride body. Sample No. 12 was granules of spherical shape, whereas sample No. 13 was a placing powder having a non-spherical shape. The contents of each of magnesium oxide (MgO) and erbium oxide (Er₂O₃), when the total sum of silicon nitride and the sum of these additive ingredients was 100% by mass, were both 2% by mass in both samples. The densities of the granular bodies 1b were 208 pieces/cm² in both samples. The spherically shaped granules used in sample No. 12 were prepared by mixing and pulverizing the powders stated above and making the mixture into a slurry, followed by drying the slurry with a spray dryer. The non-spherically shaped placing powder used in sample No. 13 was prepared by pulverizing a sintered body obtained by calcining the above described powders.

Then, a plurality of silicon nitride bodies mounted with powder/granular bodies on their principal surfaces were piled together for each sample, and the pile in this state was placed inside a calcining furnace installed with a graphite resistance heating element, and the pile was calcined. In order to suppress the volatilization of ingredients contained in the silicon nitride body, a common material containing magnesium oxide (MgO) and erbium oxide (Er₂O₃) was placed in the calcining furnace. The temperature was raised from room temperature to 500° C. in a vacuum atmosphere, and then, nitrogen gas was introduced into the furnace and a partial pressure of nitrogen of 30 kPa was maintained. The temperature inside the calcining furnace was further raised to 1750° C. and was maintained for 7 hours to prepare samples No. 12 and 13 of silicon nitride substrates having a length of 60 mm, a width of 4 mm and a thickness of 3 mm.

As a comparative example, sample No. 14 of silicon nitride substrate was prepared by calcining the silicon nitride bodies under the same conditions as described above, except that the granular bodies 1b were not mounted on a principal surface of the silicon nitride bodies, and that the silicon nitride bodies were not piled together, but were laid flat.

The three point bending strength of each of samples No. 12 to 14 was measured in accordance with JIS R 1601-2008, and the measurements are shown in Table 2.

After measuring the three point bending strength, an area of 170 μm×170 μm was selected from a cut-out section and the configurations of the granular bodies 1b were observed with an optical microscope set at a magnification of 500 times. The results are shown in Table 2.

TABLE 2

| Sample No. | Powder/granular bodies (Type) | Granular bodies (Shape) | Three point bending strength (MPa) |
|---|---|---|---|
| 12 | Granules of spherical shape | Hemisphere | 750 |
| 13 | Placing powder having non-spherical shape | Non-hemisphere | 685 |
| 14 | — | — | 752 |

As shown in Table 2, the granular bodies 1b were integrated in a hemisphere against the principal surface of the substrate 1a in sample No. 12, so that residual stress in the vicinities of the granular bodies 1b after calcining was less likely to remain, compared to sample No. 13 in which the granular bodies 1b were integrated in configurations other than a hemisphere against the principal surface of the substrate 1a. Thus, the strength of the substrate 1a in sample No. 12 was comparable to that of sample No. 14.

EXAMPLE 3

First, a silicon nitride body was prepared by the same method as the method described in Example 1.

Then, a placing powder which was powder/granular bodies mainly made of silicon nitride and, as additive ingredients, magnesium oxide (MgO) and erbium oxide ($Er_2O_3$) was mounted on a principal surface of a silicon nitride body in an arrangement shown in Table 3. The contents of magnesium oxide (MgO) and erbium oxide ($Er_2O_3$), when the total sum of silicon nitride and the sum of these additive ingredients was 100% by mass, were both 2% by mass. The density of powder/granular bodies was 25 pieces/$cm^2$.

Then, a plurality of silicon nitride bodies mounted with powder/granular bodies on their principal surfaces were piled together for each sample, and the pile in this state was placed inside a calcining furnace installed with a graphite resistance heating element, and the pile was calcined. In order to suppress the volatilization of ingredients contained in the silicon nitride body, a common material containing magnesium oxide (MgO) and erbium oxide ($Er_2O_3$) was placed in the calcining furnace. The temperature was raised from room temperature to 500° C. in a vacuum atmosphere, and then, nitrogen gas was introduced into the furnace and a partial pressure of nitrogen of 30 kPa was maintained. The temperature inside the calcining furnace was further raised to 1750° C. and was maintained for 6 hours to prepare samples No. 15 to 17 of silicon nitride substrates having a length of 60 mm, a width of 30 mm and a thickness of 0.32 mm.

Samples No. 15 to 17 were silicon nitride substrates of the configurations shown in FIGS. 1, 3 and 4, respectively.

The circuit members 2 each having a size of 10 mm×26 mm in an amount of five were bonded to each of the samples, mediated sequentially by the brazing material 4a and the intermediate material 5a by the same method as that of Example 1. Then, peel strengths of the five circuit members 2 were measured for each sample, and the dispersions in the peel strengths for each sample were ranked. The sample having the least dispersion was rated as "1", the one having the second least dispersion was rated as "2" and the one having the largest dispersion was rated as "3". The results are shown in Table 3.

TABLE 3

| Sample No. | Figure indicating the shape of silicon nitride substrate used in Sample | Granular bodies in the X-direction | Granular bodies in the Y-direction | Rank of the dispersion in peel strength |
|---|---|---|---|---|
| 15 | FIG. 1 | — | — | 3 |
| 16 | FIG. 3 | In lines | — | 2 |
| 17 | FIG. 4 | In lines | In lines | 1 |

As shown in Table 3, samples No. 16 and 17 had the granular bodies 1b arranged in a plurality of lines, and thus the dispersions in peel strengths were small, and consequently the dispersions in bond strengths were also small compared to those of sample No. 15.

In particular, sample No. 17 had the granular bodies 1b arranged in a plurality of lines both in the X-direction and the Y-direction, and thus the idispersions in peel strengths were the least among the three. It was found that the reliability of the sample when used as the circuit substrate 10 could be enhanced.

EXAMPLE 4

First, a silicon nitride body was prepared by the same method as the method described in Example 1.

Then, a placing powder which was powder/granular bodies made of a powder mainly made of silicon nitride and, as additive ingredients, ingredients shown in Table 4 was mounted on a principal surface of a silicon nitride body. The contents of the additive ingredients, when the total sum of silicon nitride and the sum of these additive ingredients was 100% by mass, were as given in Table 4. The densities of powder/granular bodies were 301 pieces/$cm^2$ in all samples.

Then, by calcining the samples by the same method as the method shown in Example 3, samples No. 18 to 20 of silicon nitride substrates having a length of 60 mm, a width of 40 mm and a thickness of 3 mm were prepared.

Then, the three point bending strength of each of the samples No. 18 to 20 was measured in accordance with JIS R 1601-2008 (ISO 17565: 2003 (MOD)), and the measurements are shown in Table 4.

Samples No. 18 to 20 were immersed in hydrochloric acid with a concentration of 30% by mass, and were heat-treated for 100 hours at 90° C. The mass of each of the samples before and after the heat treatment was measured, and the reduction rate was calculated. The figures are shown in Table 4. The three point bending strength of each of the samples after the heat treatment was measured in accordance with JIS R 1601-2008 (ISO 17565: 2003 (MOD)), and the measurements are shown in Table 4.

Ingredients constituting an oxide of aluminum contained in the granular bodies 1b were identified by a thin film X-ray diffraction method, and it was found that sample No. 19 contained aluminum oxide, and sample No. 20 contained magnesium aluminate.

TABLE 4

| Sample No. | Content of powder/granular bodies (mass %) | | | | | Three point bending strength (MPa) | | |
|---|---|---|---|---|---|---|---|---|
| | Magnesium oxide (MgO) | Erbium oxide ($Er_2O_3$) | Aluminum oxide ($Al_2O_3$) | Magnesium aluminate ($MgAl_2O_4$) | Total | Immersing in hydrochloric acid, before heat treatment | Immersing in hydrochloric acid, after heat treatment | Reduction rate (%) |
| 18 | 1 | 1 | — | — | 2 | 660 | 630 | 0.110 |
| 19 | 1 | 1 | 1 | — | 3 | 680 | 660 | 0.065 |
| 20 | — | 1 | — | 1 | 2 | 700 | 690 | 0.010 |

As shown in Table 4, each of samples No. 19 and 20 contained an oxide of aluminum in its granular bodies 1b, and liquid phase sintering was further accelerated in the sintering step. Thus, the granular bodies 1b were firmly bonded to the substrate 1a, and the mechanical strength was found to be enhanced. Moreover, the oxide of aluminum in sample No. 20 was magnesium aluminate, thus the corrosion resistance of the grain boundary phase present in the space between the crystals forming the granular bodies 1b was improved and the corrosion resistance of the granular bodies 1b was enhanced. Therefore, even after the sample was immersed in hydrochloric acid with a concentration of 30% by mass, and was heat-treated, the reduction rate of sample mass was small compared to that of samples No. 18 and 19, and the mechanical strength was found to be less likely to decline.

EXAMPLE 5

First, a powder of silicon nitride with a betalization degree of 10%, i.e., an alphalization degree of 90%, and, as additive ingredients, a powder of magnesium oxide (MgO) and a powder of erbium oxide ($Er_2O_3$) were wet-mixed with a tumbling mill, and were pulverized, until the particle diameter ($D_{90}$) was reduced to 1 μm or less, and were made into a slurry.

The contents of magnesium oxide (MgO) and erbium oxide ($Er_2O_3$) in the substrate 1a were conditioned to be 3% by mass and 14% by mass respectively, and the content of aluminum oxide ($Al_2O_3$) was conditioned to assume the values as shown in Table 5.

Then, a silicon nitride body was prepared by the same method as the method described in Example 1.

Then, granules of powder/granular bodies mainly made of silicon nitride, in which contents of magnesium oxide (MgO), erbium oxide ($Er_2O_3$) and aluminum oxide ($Al_2O_3$) in the granular bodies 1b were conditioned to be 3% by mass, 14% by mass and 0.5% by mass respectively, were prepared by the same method as the method described in Example 1. Then, powder/granular bodies were mounted on a principal surface of a silicon nitride body of each sample with a roller. The density of the powder/granular bodies was 301 pieces/$cm^2$, and silicon nitride substrates were prepared by the same method as the methods for preparing samples No. 2 to 11 described in Example 1.

Ingredients constituting an oxide of aluminum contained in each of the substrate 1a and the granular bodies 1b were identified by a thin film X-ray diffraction method, and it was found that the oxide of aluminum was aluminum oxide expressed by the composition formula $Al_2O_3$ in both cases. The contents of the oxide were obtained by ICP optical emission spectrometry and the values are shown in Table 5.

The thermal diffusivity (α) in the thickness direction of each of the samples was measured by a two dimensional method by laser flash with a thermal constant measuring device (TC-7000 manufactured by ULVAC-RIKO, Inc.). The specific heat capacity (C) of each of the samples was measured by a differential scanning calorimetry method (DSC Method) with an ultra sensitive differential scanning calorimeter (DSC-6200 manufactured by Seiko Instruments Inc.). Moreover, the bulk density (ρ) (kg/$m^3$) of each of the samples was measured in accordance with JIS R 1634-1998.

Values obtained by the above described methods were substituted for α, C and ρ in the following equation κ=α×C×ρ, and the thermal conductivity κ(W/(m×K)) in the thickness direction of each of the samples was calculated. Values of the thermal conductivity for the samples are shown in Table 5.

TABLE 5

| Sample No. | Content of aluminum oxide (mass %) | | Thermal conductivity (W/(m · K)) |
|---|---|---|---|
| | Substrates | Granular bodies | |
| 21 | 0.1 | 0.5 | 71 |
| 22 | 0.3 | 0.5 | 67 |
| 23 | 0.5 | 0.5 | 55 |
| 24 | 1 | 0.5 | 54 |

As shown in Table 5, in samples No. 21 and 22, the content of an oxide of aluminum in the substrate 1a was smaller than that in the granular bodies 1b, thus the samples had high heat conductivities compared to those of samples No. 23 and 24 in which the content of an oxide of aluminum in the granular bodies 1b was smaller than that in the substrate 1a. Thus, phonon propagation in samples No. 21 and 22 was accelerated in the crystals forming the substrate 1a and in the grain boundary phase present in the space between the crystals, and it was found that heat transfer between both principal surfaces of the substrate 1a was accelerated.

EXAMPLE 6

First, a silicon nitride body was prepared by the same method as the method described in Example 5.

Then, granules of powder/granular bodies mainly made of silicon nitride, and additive ingredients differentiated by using magnesium oxide (MgO), erbium oxide ($Er_2O_3$), aluminum oxide ($Al_2O_3$), carbon and others, were prepared by the same method as the method described in Example 1. Then, the granules were mounted on a principal surface of a silicon nitride body of each of the samples using rollers having different surface configurations. The density of powder/granular bodies was 301 pieces/$cm^2$. By calcining the samples with the same method as the method described in Example 3, samples No. 25 to 29 of silicon nitride substrates having a length of 60 mm, a width of 40 mm and a thickness of 3 mm were prepared.

Then, by using those obtained by calcining each of the powder/granular bodies alone with the same method as the above described method, contents of carbon and oxygen in the granular bodies 1b were measured by a carbon analysis method and an oxygen analysis method respectively, and the measurements are shown in Table 6. The content of oxygen in the granular bodies 1b included not only oxygen present independently, but also oxygen constituting metal oxides and oxynitrides.

The dielectric breakdown voltage of silicon nitride substrate for each of the samples was measured in accordance with JIS C 2110-1994 (IEC 60243: 1967 (MOD)), and the measurements are shown in Table 6.

TABLE 6

| Sample No. | Granular bodies | | Dielectric breakdown voltage (MV/m) |
|---|---|---|---|
| | Carbon (mass %) | Oxygen (mass %) | |
| 25 | 0.02 | 3.5 | 47 |
| 26 | 0.05 | 2.5 | 45 |
| 27 | 0.05 | 3.5 | 43 |
| 28 | 0.05 | 4.5 | 37 |
| 29 | 0.08 | 3.5 | 36 |

As shown in Table 6, when samples No. 25, 27 and 29, which had the same oxygen content in the granular bodies 1b, were compared with each other, it was found that carbon contents were 0.05% by mass or less in samples No. 25 and 27 so that the content of carbon having electrical conductivity was limited, thus samples No. 25 and 27 had a higher dielectric breakdown voltage and were less likely to generate leak current than sample No. 29.

When samples No. 26, 27 and 28, which had the same carbon content in the granular bodies 1b, were compared with each other, it was found that samples No. 26 and 27 had a higher dielectric breakdown voltage and were less likely to generate leak current than sample No. 28, thus the content of oxygen was found to be preferably 3.5% by mass or less.

EXAMPLE 7

First, a powder of silicon nitride with a betalization degree of 10%, i.e., an alphalization degree of 90%, and, as additive ingredients, a powder of magnesium oxide (MgO) and a powder of erbium oxide ($Er_2O_3$) were wet-mixed with a tumbling mill, and were pulverized, until the particle diameters ($D_{90}$) were reduced to 0.6 μm or less, 0.8 μm or less and 1.0 μm or less as shown in Table 7, and were further made into three types of slurries.

When the total sum of the powder of silicon nitride and the sum of the powders of the additive ingredients was to be defined as 100% by mass, then the powder of the additive ingredients, i.e., the powder of magnesium oxide (MgO) and the powder of erbium oxide ($Er_2O_3$) would have accounted for 5% by mass and 10% by mass, respectively.

Then, the resultant slurries were passed through a sieve having a mesh of a particle size number of 250 set forth in ASTM E 11-61, and then were dried with a spray dryer to obtain three types of silicon nitride granules. The three types of silicon nitride granules were molded into a sheet-like configuration of ceramic green sheets by a powder rolling method. The ceramic green sheets were cut into a given length and silicon nitride bodies were obtained.

Then, powder/granular bodies mainly made of silicon nitride, and additive ingredients of magnesium oxide (MgO) and erbium oxide ($Er_2O_3$) were mounted using a roller on a principal surface of a silicon nitride compact of each sample.

Then, each sample was calcined by the same method as the method described in Example 2 to obtain samples No. 30 to 32 of silicon nitride substrates having a length of 60 mm, a width of 4 mm and a thickness of 3 mm.

Then, the three point bending strength of each of samples No. 30 to 32 was measured in accordance with JIS R 1601-2008, and the measurements are shown in Table 7. In order to measure each of the average particle diameters of crystals mainly made of silicon nitride in the substrate 1a and in the granular bodies 1b, respectively, a portion of each sample was cut out and embedded in a resin. The cut-out surface was polished by a cross section polisher method to obtain a polished surface, which was then measured with an optical microscope set at a magnification of 200 times in accordance with JIS R 1670-2006, and the measurements are shown in Table 7.

TABLE 7

| Sample No. | Particle diameters ($D_{90}$) (μm) | Average particle diameters of crystals of silicon nitride (μm) | | Three point bending strength (MPa) |
|---|---|---|---|---|
| | | Substrates | Granular bodies | |
| 30 | ≤0.6 | 12 | 16 | 760 |
| 31 | ≤0.8 | 14 | 16 | 750 |
| 32 | ≤1.0 | 16 | 16 | 690 |

As shown in Table 7, samples No. 30 and 31 were made of crystals mainly made of silicon nitride, in which the average particle diameter of the crystals in the substrate 1a was smaller than the average particle diameter of the crystals in the granular bodies 1b, thus the strength of the substrate 1a could be heightened compared to sample No. 32 in which the average particle diameter of the crystals in the substrate 1a was the same as the average particle diameter of the crystals in the granular bodies 1b. Thus, it was found that the thickness of the circuit substrate 10 may be made small as in the case of the support substrate 1 with little fear of impairing its reliability.

Accordingly, it is now clear that the silicon nitride substrate of the present invention produces a high anchor effect due to a plurality of granular bodies 1b containing silicon integrated to a principal surface of a substrate, in which a plurality of the needle crystals 1c or the column crystals 1d mainly made of silicon nitride are extended from a portion of the granular bodies 1b; and that, when the silicon nitride substrate of the present invention is used as the support substrate 1, adhesion of a brazing material to the support substrate 1 is enhanced so that the support substrate 1, and the circuit member 2 and the heat radiation member 3 may be firmly bonded to render the circuit substrate 10 highly reliable. Moreover, it is now clear that the electronic components 6 and 7 are mounted on the circuit member 2 using such a highly reliable circuit substrate 10 that repeated heat generation by the electronic components 6 and 7 will not cause the support substrate 1, and the circuit member 2 and the heat radiation member 3 to detach easily from each other; therefore, that an electronic device S with high durability is being made possible.

DESCRIPTION OF THE REFERENCE NUMERALS

1: Silicon nitride substrate (Support substrate)
1a: Substrate

1b: Granular body
1c: Needle crystal
1d: Column crystal
1e: Second needle crystal
1f: Second column crystal
2: Circuit member
3: Heat radiation member
4a, 4b: Brazing material
5a, 5b: Intermediate material
6, 7: Electronic component
10: Circuit substrate
20: Thermoelectric conversion module
S: Electronic device

The invention claimed is:

1. A silicon nitride substrate comprising a substrate comprising a silicon nitride sintered body, and a plurality of granular bodies containing silicon and integrated to a principal surface of the substrate, wherein
a plurality of needle crystals or column crystals comprising mainly silicon nitride are extended from a surface of the granular bodies at an extended length of 2 μm or more and 10 μm or less, and wherein
a diameter of the needle crystals or the column crystals at the middle of the extended length is 0.2 μm or more and 5 μm or less.

2. The silicon nitride substrate according to claim 1, wherein the granular bodies are integrated in a hemisphere form to the principal surface of the substrate.

3. The silicon nitride substrate according to claim 1, wherein the granular bodies are arranged in a plurality of lines.

4. The silicon nitride substrate according to claim 1, wherein the density of the granular bodies is 48 pieces/cm$^2$ or more and 502 pieces/cm$^2$ or less.

5. The silicon nitride substrate according to claim 1, wherein the granular bodies contain an oxide of aluminum.

6. The silicon nitride substrate according to claim 5, wherein the content of the oxide of aluminum in the substrate is less than that in the granular bodies.

7. The silicon nitride substrate according to claim 1, wherein the carbon content of the granular bodies is 0.05% by mass or less.

8. The silicon nitride substrate according to claim 1, wherein the oxygen content of the granular bodies is 3.5% by mass or less.

9. The silicon nitride substrate according to claim 1, wherein a plurality of second needle crystals or column crystals comprising mainly silicon nitride are extended from the principal surface of the substrate, and wherein the diameters of the needle crystals or column crystals are smaller than those of the second needle crystals or column crystals.

10. The silicon nitride substrate according to claim 1, wherein the substrate comprises crystals comprising mainly silicon nitride, wherein the crystals have a smaller average particle size than the granular bodies have.

11. A circuit substrate comprising a support substrate comprising the silicon nitride substrate according to claim 1, and a metallic circuit member bonded through a brazing material to one principal surface of the support substrate, and a metallic heat radiation member bonded through a brazing material to the other principal surface of the support substrate.

12. An electronic device comprising electronic components mounted on the circuit member in the circuit substrate according to claim 11.

* * * * *